(12) United States Patent
Murooka

(10) Patent No.: US 9,293,704 B2
(45) Date of Patent: Mar. 22, 2016

(54) MEMORY DEVICE AND METHOD OF MANUFACTURING MEMORY DEVICE

(71) Applicant: KABUSHIKI KAISHA TOSHIBA, Minato-ku (JP)

(72) Inventor: Kenichi Murooka, San Jose, CA (US)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/592,742

(22) Filed: Jan. 8, 2015

(65) Prior Publication Data

US 2015/0207072 A1 Jul. 23, 2015

Related U.S. Application Data

(62) Division of application No. 14/017,703, filed on Sep. 4, 2013, now Pat. No. 8,963,115.

(60) Provisional application No. 61/811,392, filed on Apr. 12, 2013.

(51) Int. Cl.
*H01L 45/00* (2006.01)
*H01L 27/24* (2006.01)
*G11C 13/00* (2006.01)

(52) U.S. Cl.
CPC .......... *H01L 45/1641* (2013.01); *H01L 27/249* (2013.01); *H01L 27/2436* (2013.01);
(Continued)

(58) Field of Classification Search
CPC ............ H01L 27/0688; H01L 27/2481; H01L 27/249; H01L 45/04; G11C 2213/71; G11C 13/0002

USPC ...................... 257/4, 5, E21.614; 365/51, 148
See application file for complete search history.

(56) References Cited

U.S. PATENT DOCUMENTS 8,295,077 B2   10/2012   Murooka
8,891,277 B2   11/2014   Murooka
(Continued)

FOREIGN PATENT DOCUMENTS

JP    2008-135744    6/2008
JP    2008-277543    11/2008
(Continued)

OTHER PUBLICATIONS

U.S. Appl. No. 14/156,595, filed Jan. 16, 2014, Murooka.
(Continued)

*Primary Examiner* — Matthew Reames
*Assistant Examiner* — John Bodnar
(74) *Attorney, Agent, or Firm* — Oblon, McClelland, Maier & Neustadt, L.L.P.

(57) ABSTRACT

According to one embodiment, a memory device includes a first conductive line extending in a first direction, second conductive lines each extending in a second direction intersect with the first direction, a third conductive line extending in a third direction intersect with the first and second directions, an insulating layer disposed between the second conductive lines and the third conductive line, resistance change elements each disposed on one of first and second surfaces of each of the second conductive lines in the third direction, and each connected to the third conductive line, a semiconductor layer connected between the first conductive line and one end of the third conductive line, and a select FET having a select gate electrode, and using the semiconductor layer as a channel.

7 Claims, 28 Drawing Sheets

(52) U.S. Cl.
CPC ............ *H01L27/2481* (2013.01); *H01L 45/04* (2013.01); *H01L 45/145* (2013.01); *G11C 13/0002* (2013.01); *G11C 2213/71* (2013.01); *H01L 45/1616* (2013.01)

(56) References Cited

U.S. PATENT DOCUMENTS

| | | |
|---|---|---|
| 2008/0123390 A1 | 5/2008 | Kim et al. |
| 2008/0265235 A1 | 10/2008 | Kamigaichi et al. |
| 2009/0289251 A1 | 11/2009 | Kiyotoshi |
| 2010/0155687 A1 | 6/2010 | Reyes et al. |
| 2011/0299321 A1 | 12/2011 | Murooka |
| 2012/0147644 A1 | 6/2012 | Scheuerlein |
| 2012/0147645 A1 | 6/2012 | Scheuerlein |
| 2012/0147646 A1 | 6/2012 | Scheuerlein |
| 2012/0147647 A1 | 6/2012 | Scheuerlein |
| 2012/0147648 A1 | 6/2012 | Scheuerlein |
| 2012/0147649 A1 | 6/2012 | Samachisa et al. |
| 2012/0147650 A1 | 6/2012 | Samachisa et al. |
| 2012/0147651 A1 | 6/2012 | Scheuerlein et al. |
| 2012/0147652 A1 | 6/2012 | Scheuerlein |
| 2012/0147689 A1 | 6/2012 | Scheuerlein et al. |
| 2013/0148400 A1 | 6/2013 | Murooka |
| 2013/0187118 A1 | 7/2013 | Murooka |
| 2014/0340956 A1 | 11/2014 | Murooka |

FOREIGN PATENT DOCUMENTS

| | | |
|---|---|---|
| JP | 2009-81251 | 4/2009 |
| JP | 2009-283680 | 12/2009 |
| JP | 2010-9669 | 1/2010 |
| JP | 2010-153868 | 7/2010 |
| JP | 2010-199348 | 9/2010 |
| JP | 2010-287872 | 12/2010 |
| JP | 2011-114202 | 6/2011 |
| JP | 2011-258679 | 12/2011 |

OTHER PUBLICATIONS

U.S. Appl. No. 14/282,047, filed May 20, 2014, Murooka.
U.S. Appl. No. 14/284,516, filed May 22, 2014, Murooka.

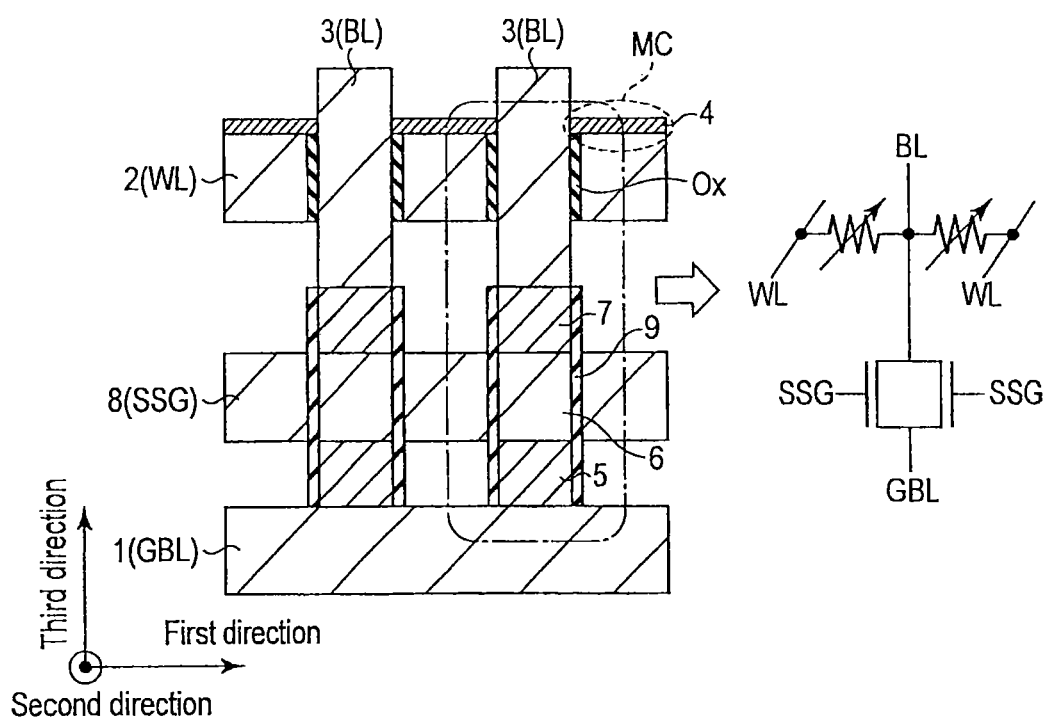
F I G. 2

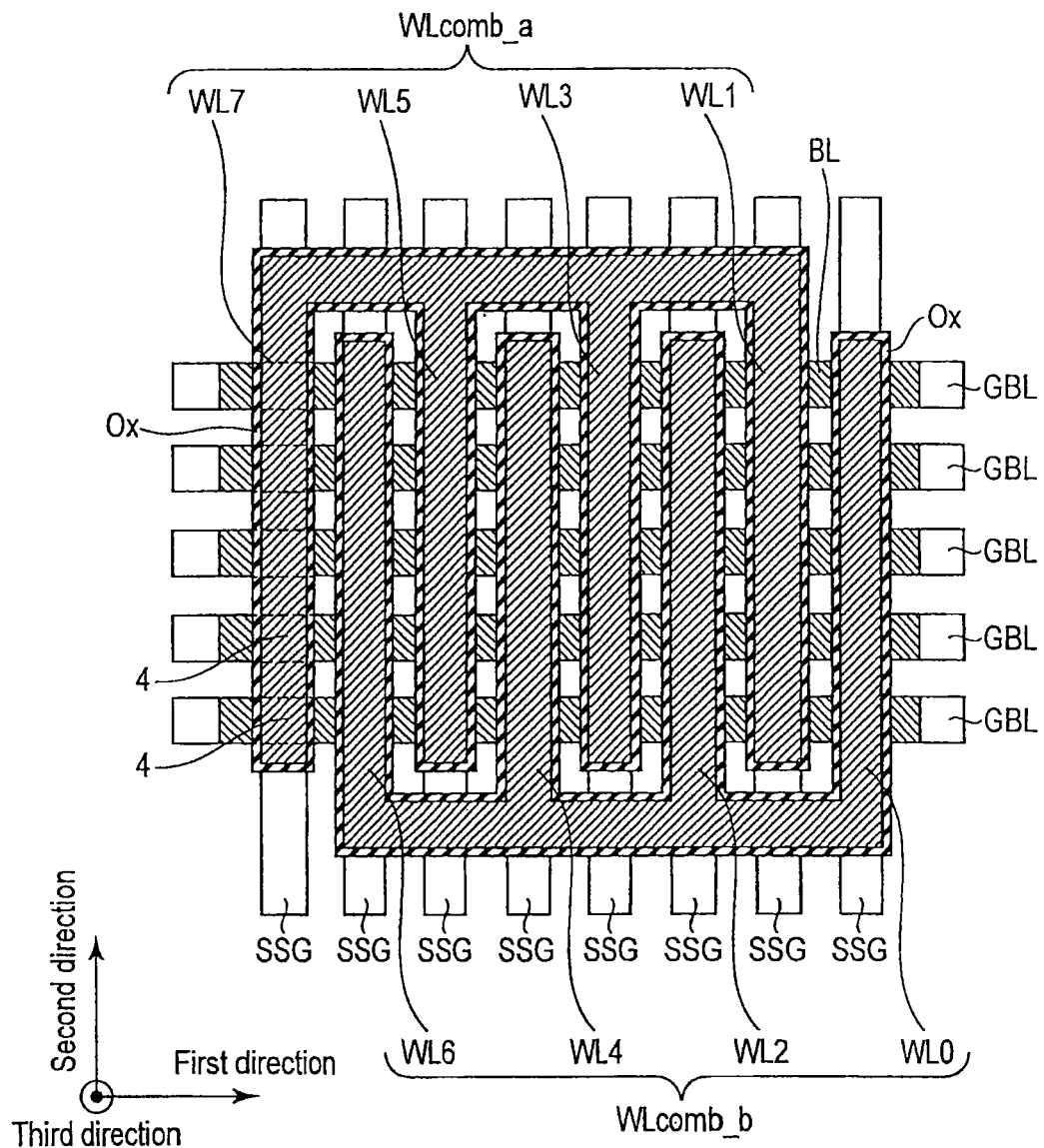
F I G. 3

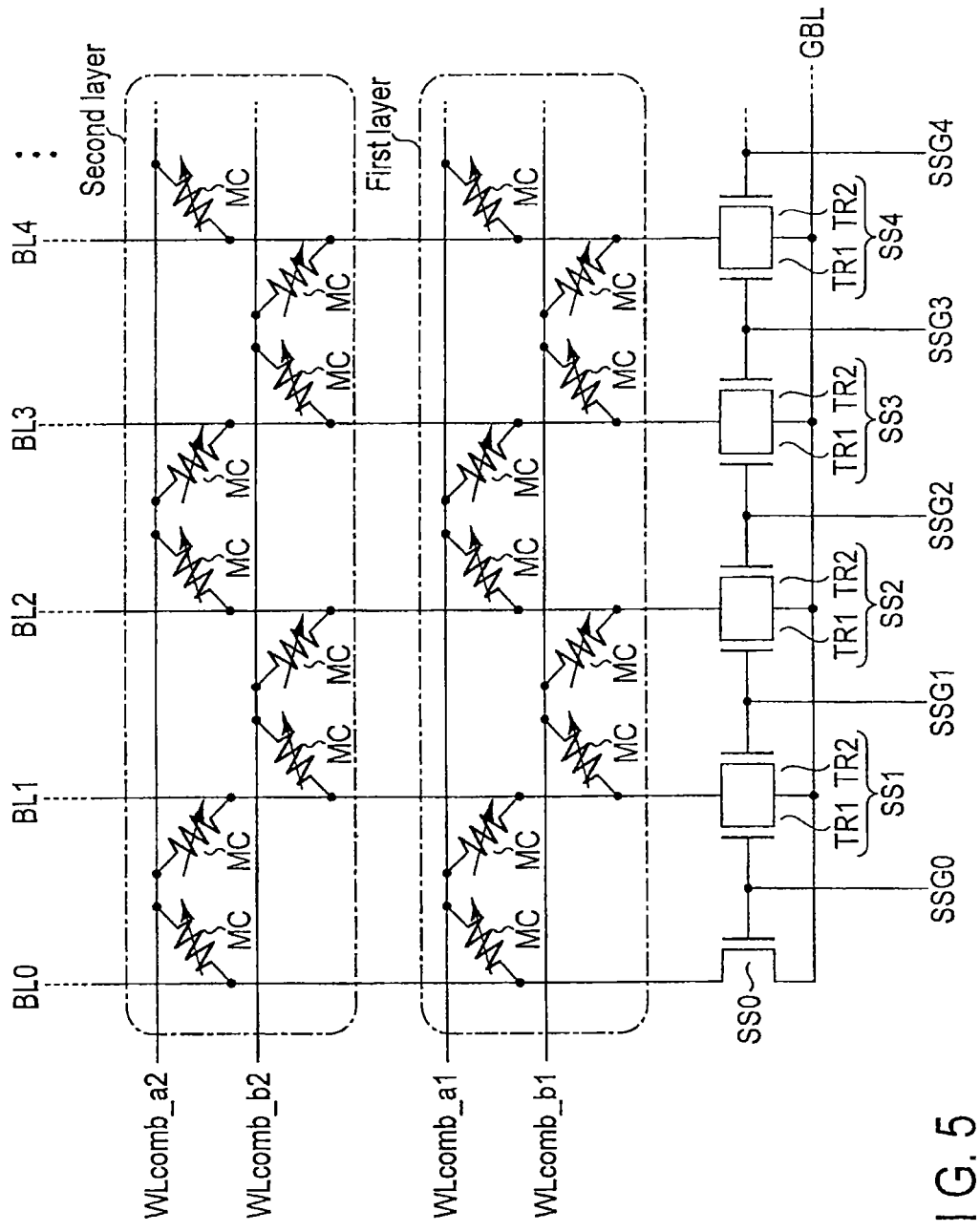
F I G. 5

|  | Write | Erase | Read | Forming |
|---|---|---|---|---|
| SSG_s | Vg_w | Vg_e | Vg_r, 0 | Vg1_f |
| SSG_n | Vg_w | Vg_e | Vg_r, 0 | Vg2_f |
| SSG_u | 0 | 0 | 0 | 0 |
| GBL_s | Vw | Vof | Vr+Vo | Vof |
| GBL_u | Vwf | Vef+Vof | Vr+Vo | Vff+Vof |
| WL_s | 0 | Ves+Vof | Vo | Vfs+Vof |
| WL_u | Vwf | Vef+Vof | Vr+Vo | Vff+Vof |

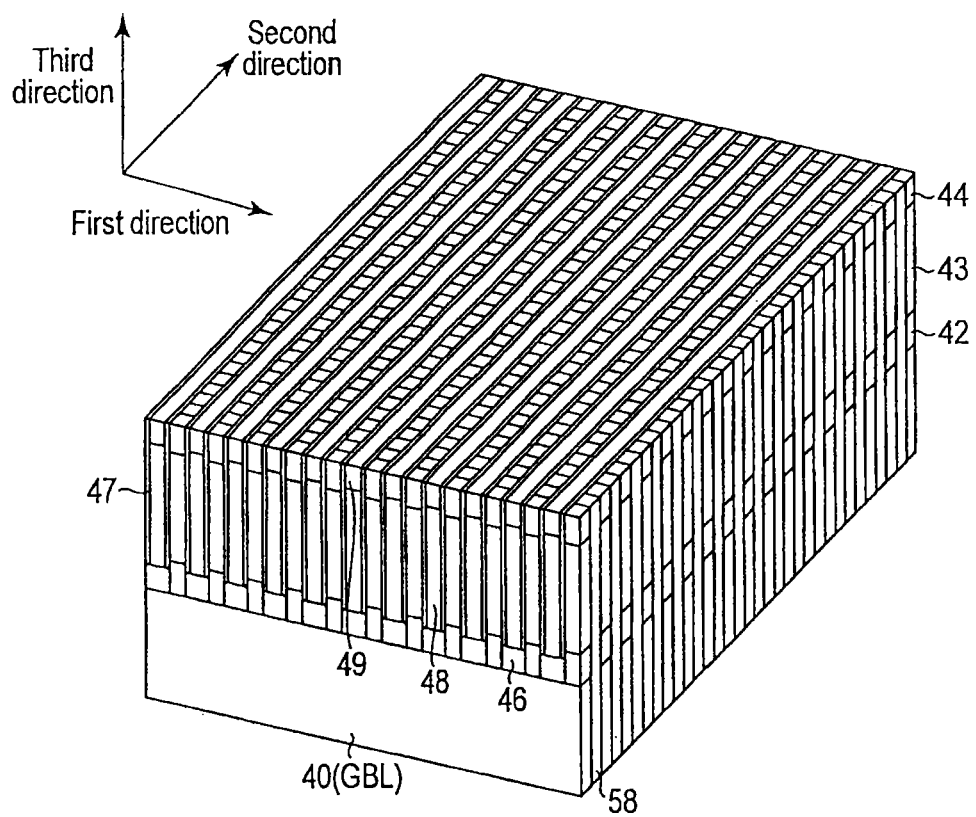
F I G. 15

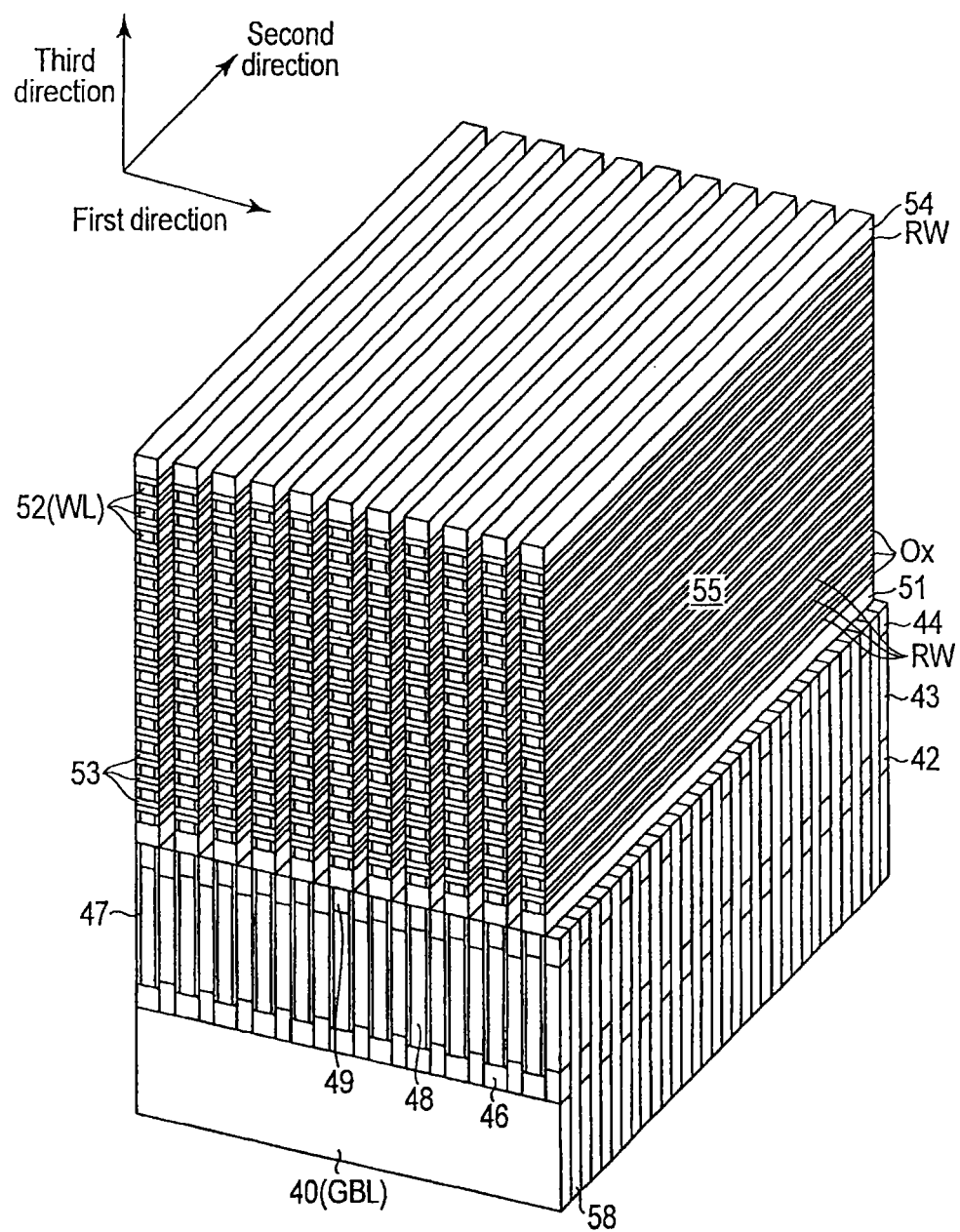
F I G. 18

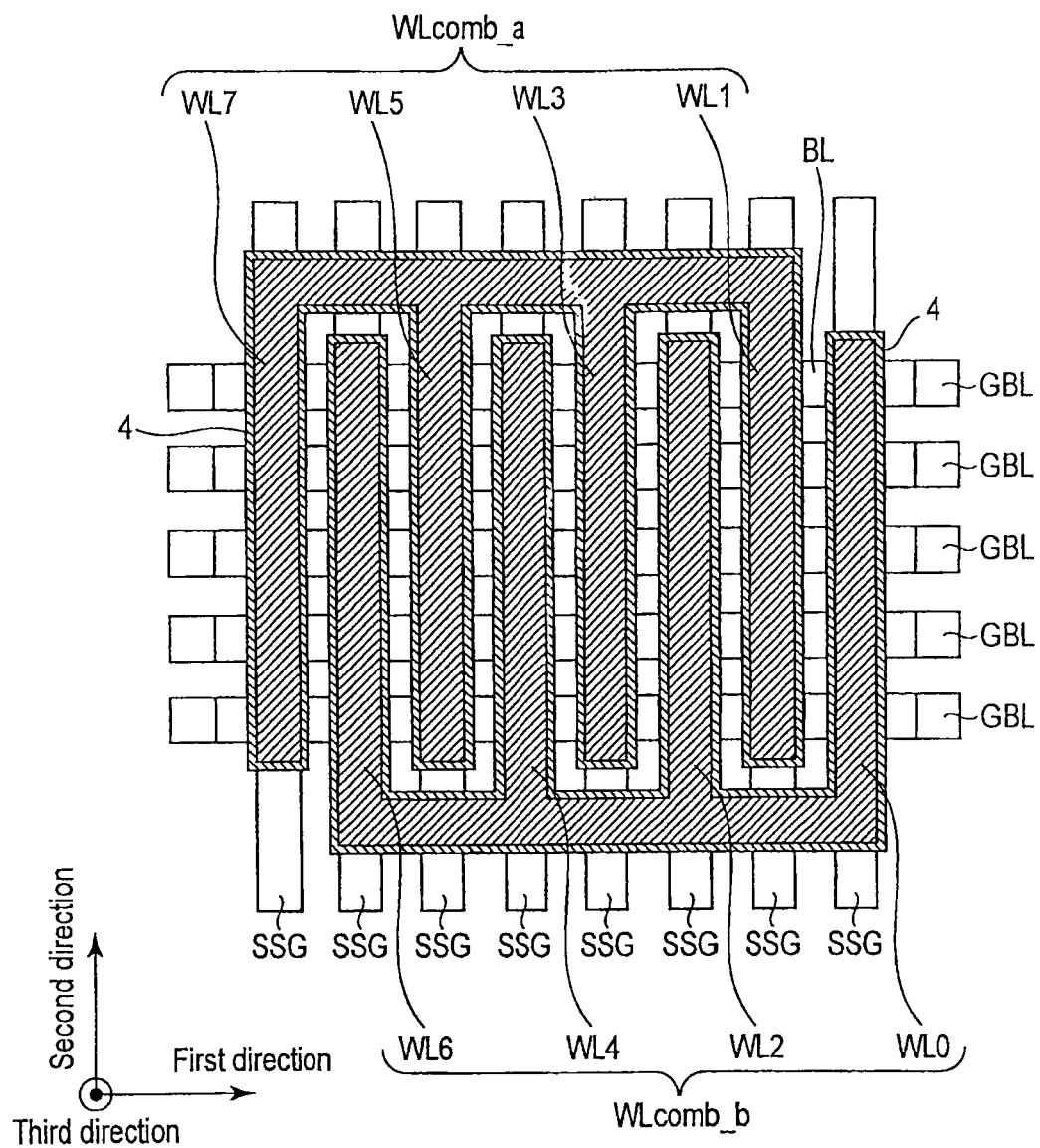
F I G. 23

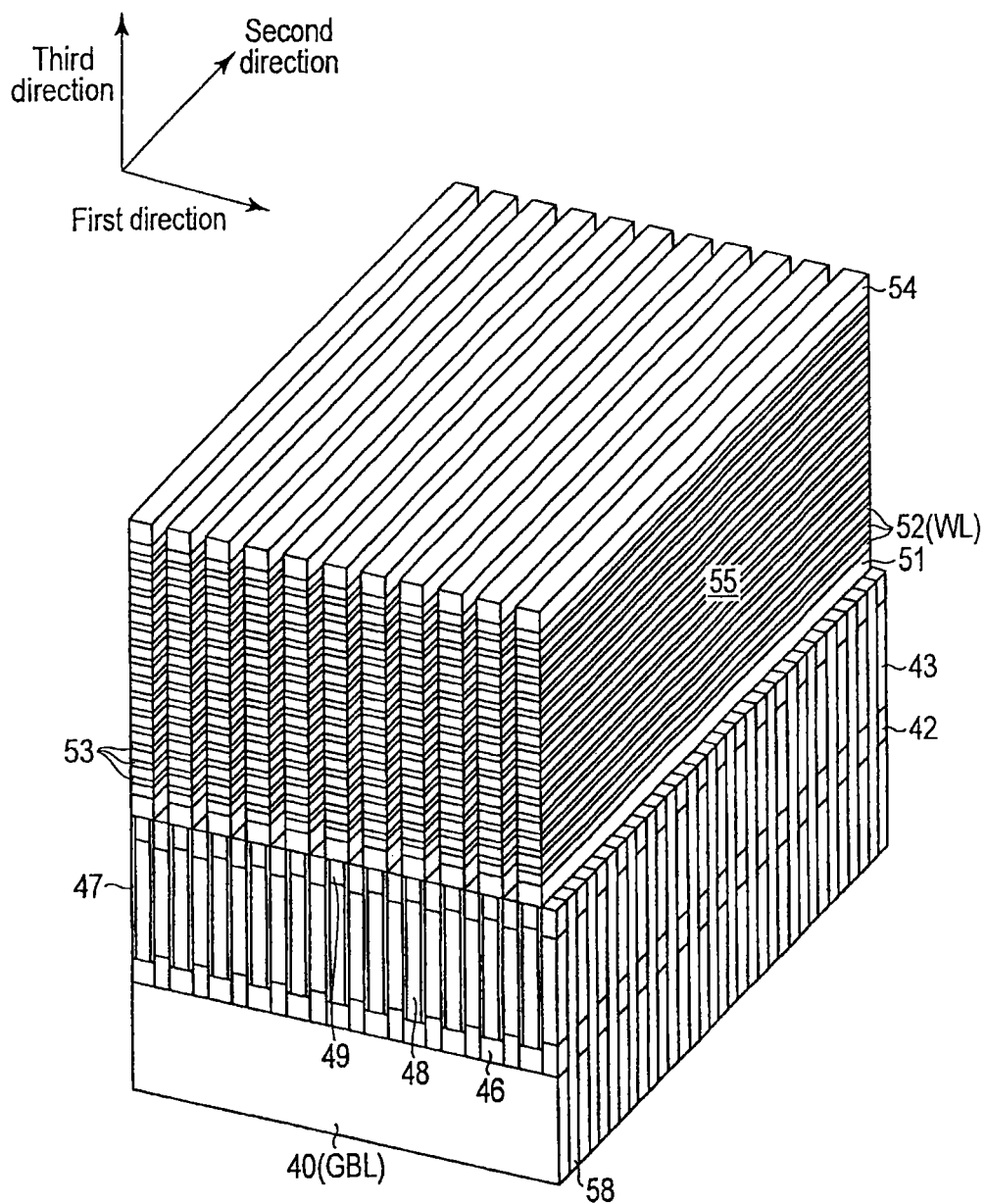
F I G. 24

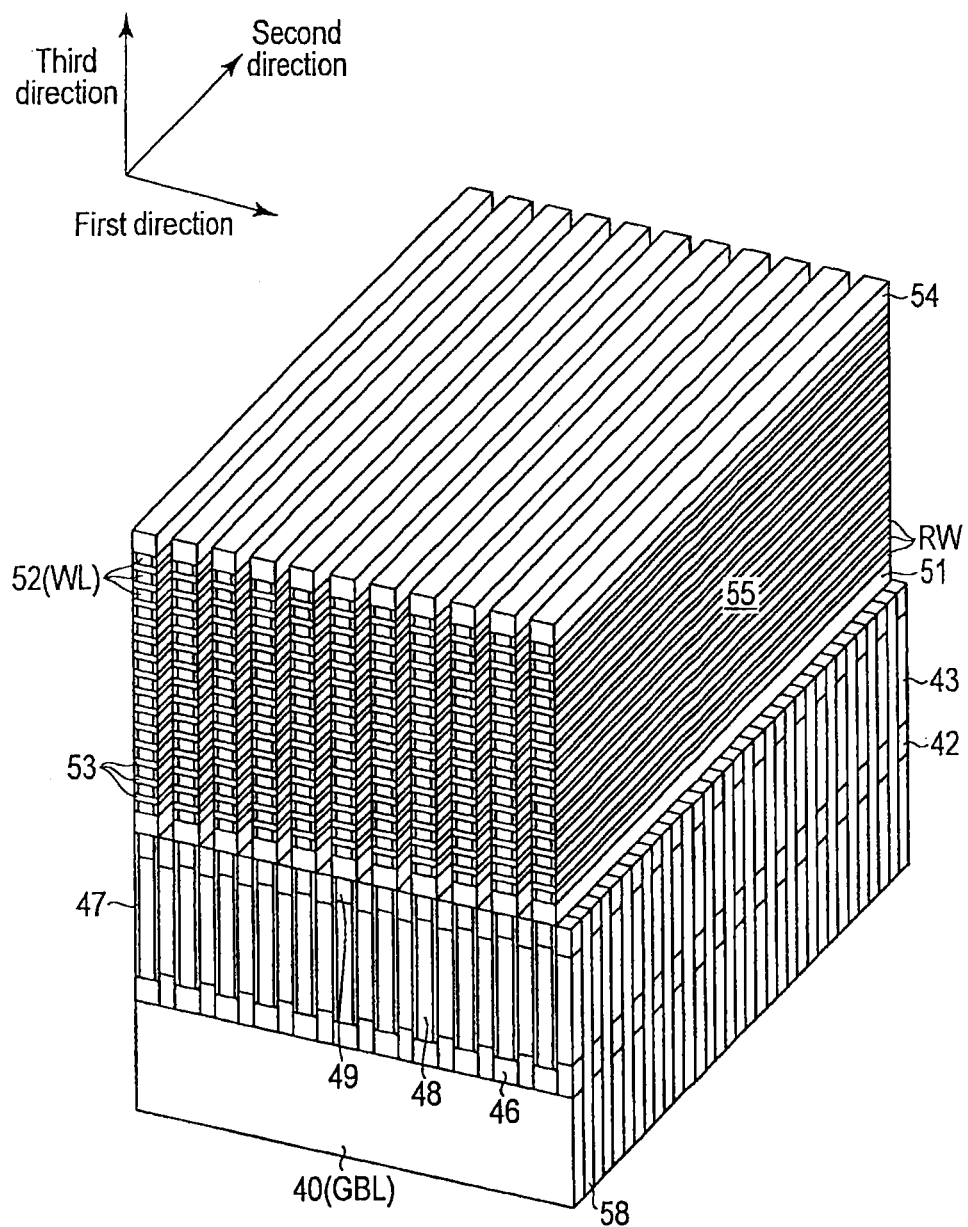
F I G. 25

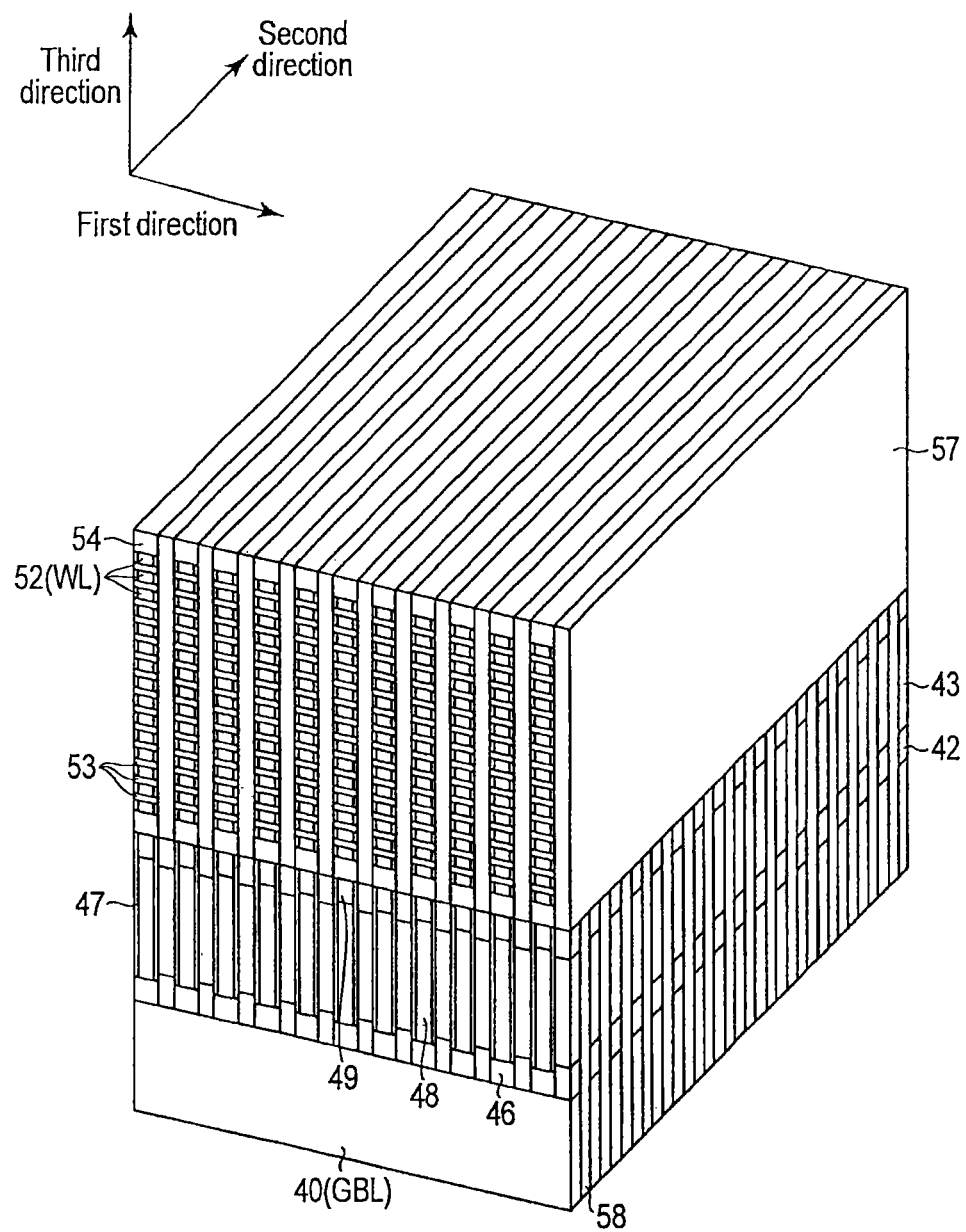
F I G. 26

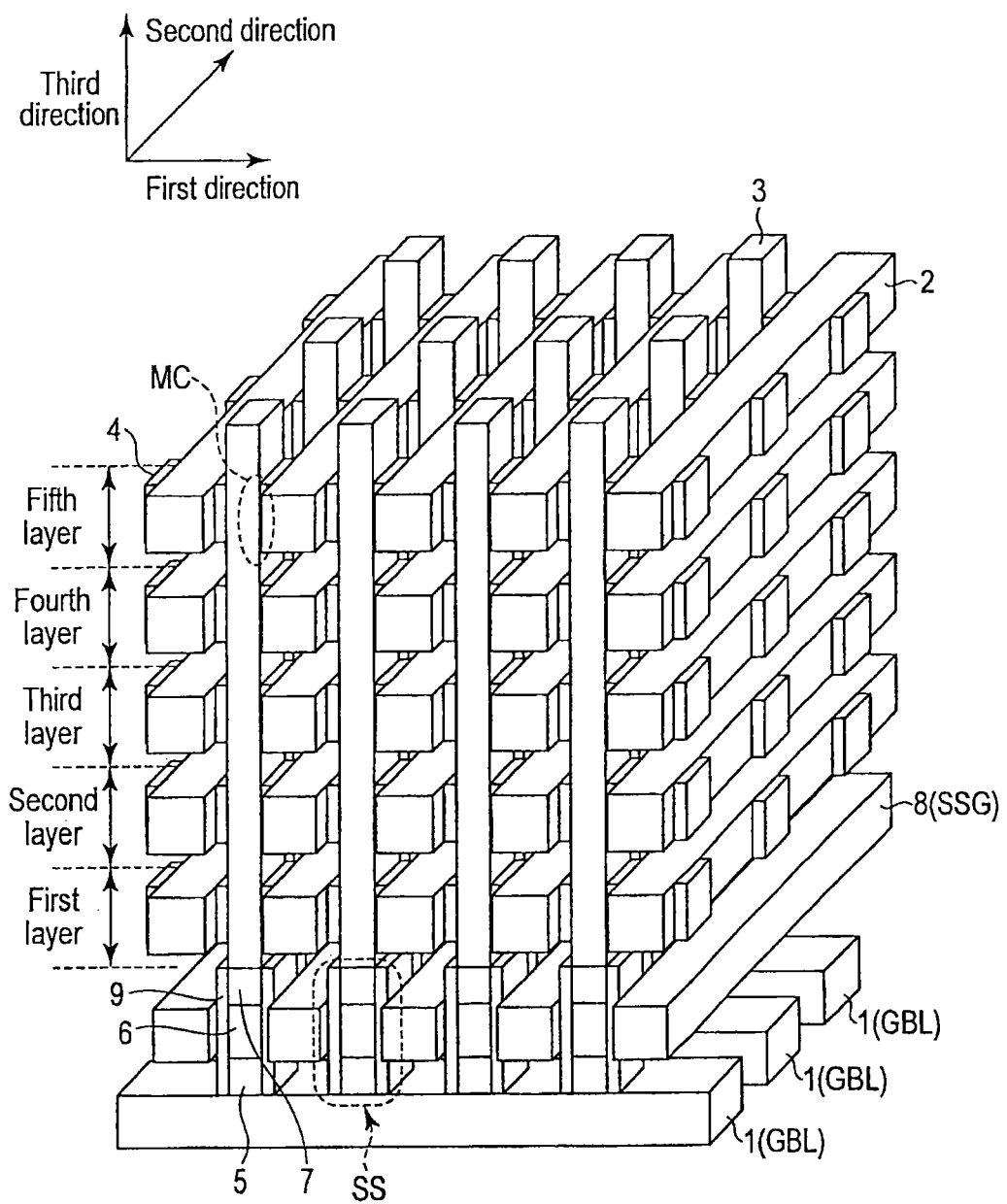
F I G. 28

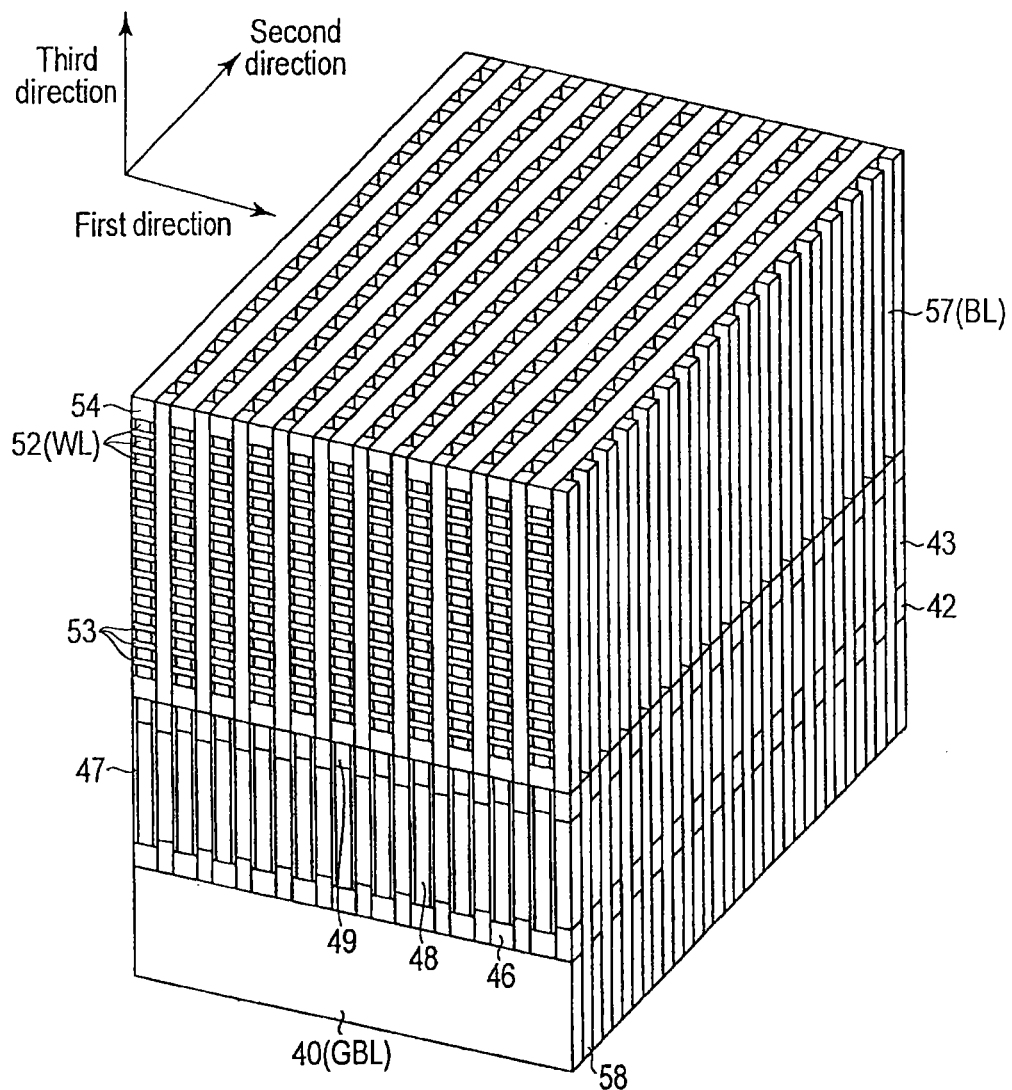
F I G. 31
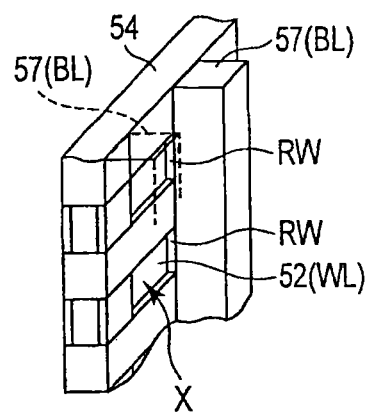
F I G. 32

US 9,293,704 B2

MEMORY DEVICE AND METHOD OF MANUFACTURING MEMORY DEVICE

CROSS-REFERENCE TO RELATED APPLICATIONS

This application is a division of and claims the benefit of priority under 35 U.S.C. §120 from U.S. Ser. No. 14/017,703, filed Sep. 4, 2013, and claims the benefit of U.S. Provisional Application No. 61/811,392, filed Apr. 12, 2013; the entire contents of both of which are incorporated herein by reference.

FIELD

Embodiments described herein relate generally to a memory device and a method of manufacturing a memory device.

BACKGROUND

Recently, there has been proposed a memory, called a resistive RAM (ReRAM), in which a memory cell is formed by a non-ohmic element represented by a diode and a resistance change material. A memory cell of a ReRAM uses no MOSFET. Therefore, it is expected that high integration beyond a conventional trend will be possible.

BRIEF DESCRIPTION OF THE DRAWINGS

FIG. 2 is an example of a partial cross-sectional view of the memory cell array of FIG. 1A;
FIG. 3 is an example of a top view of the memory cell array of FIG. 1A;
FIG. 5 is an example of a circuit diagram of the memory cell array;
FIGS. 9 to 20 are examples of perspective views illustrating a manufacturing method according to a first embodiment;
FIG. 23 is an example of a top view of the memory cell array of FIG. 21;
FIGS. 24 to 27 are examples of perspective views illustrating a manufacturing method according to a second embodiment;
FIG. 28 is an example of a partial cross-sectional view of a memory cell array of a third embodiment;
FIGS. 30 to 32 are examples of perspective views illustrating a manufacturing method according to a third embodiment.

DETAILED DESCRIPTION

Figure 1A:
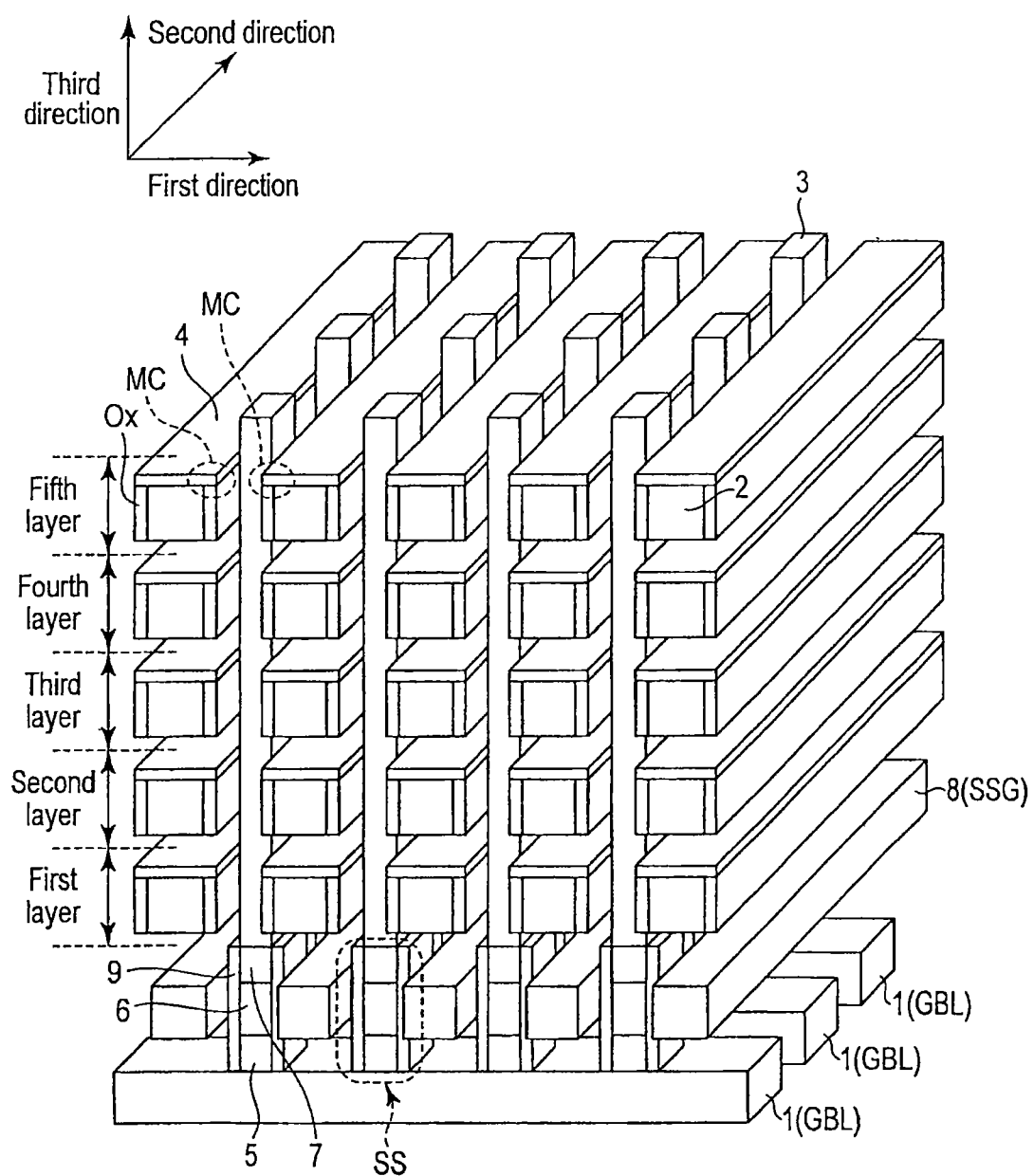
FIGS. 1A and 1B are examples of perspective views of a memory cell array according to a first embodiment.

In general, according to one embodiment, a memory device comprising: a first conductive line extending in a first direction; second conductive lines each extending in a second direction intersect with the first direction; a third conductive line extending in a third direction intersect with the first and second directions; an insulating layer disposed between the second conductive lines and the third conductive line; resistance change elements each disposed on one of first and second surfaces of each of the second conductive lines in the third direction, and each connected to the third conductive line; a semiconductor layer connected between the first conductive line and one end of the third conductive line; and a select FET having a select gate electrode, and using the semiconductor layer as a channel.

Hereinafter, embodiments will be described with reference to the drawings.

The following embodiments can achieve that, for example, the initialization of the resistance change element can be exactly performed when an initial resistance of a resistance change element (memory cell) before a forming (initialization) is small. When the initial resistance of resistance change element is small, a leakage current is generated between upper and lower word lines in a forming operation. Then the initialization of the resistance change element cannot be exactly performed.

For this reason, a new cell structure is proposed which, for example, a resistance change element attached to a word line of a lower layer and a resistance change element attached to a word line of an upper layer are separated from each other. That is, according to this cell structure, resistance change elements continuously contacting with upper and lower word lines are not present. Therefore, at the time of a forming, a generation of a leakage current between the upper and lower word lines can be suppressed, and an interference between cells can be reduced.

Herein, a resistance change material will be described.

A resistance change material, which is represented by AlON, is a material that transitions at least two resistance values: a low resistance state (LRS) and a high resistance state (HRS). It is known that a resistance change material of a high resistance state switches to a low resistance state when a voltage of a predetermined level or higher is applied thereto, and a resistance change material of a low resistance state switches to a high resistance state when more than a predetermined amount of a current flows therethrough.

In particular, an element, in which a switching from a high resistance state to a low resistance state and a switching from a low resistance state to a high resistance state are performed by application of voltages with different polarities, is called a bipolar operation element. A resistance change material performing such an operation can be provided with a thin film that is made of one of materials including TaON, TiO, TiON, $ZnMn_2O_4$, NiO, AlO, HfO, HfON, TaO, $SrZrO_3$, WO, WON, $Pr_{0.7}Ca_{0.3}MnO_3$, in addition to AlON.

As such, since many types of resistance change materials exist, their characteristics are diverse. It is preferable to prevent an interference between adjacent memory cells with the solutions provided by the present embodiment. For example, resistance change materials are classified roughly into: 1) a material, an initial resistance value of which is almost equal to or higher than the above-described high resistance state; and 2) a material, an initial resistance value of which is almost equal to or lower than the above-described low resistance state.

In the latter case, in an initial state, if a resistance change material remains between memory cells, in particular, between upper and lower word lines of a comb-shaped structure, the upper and lower word lines become close to a short-circuit state through the resistance change material. As a result, it is difficult to select a memory cell, and it is difficult to avoid an interference between cells.

1. First Embodiment

Figure 1B:
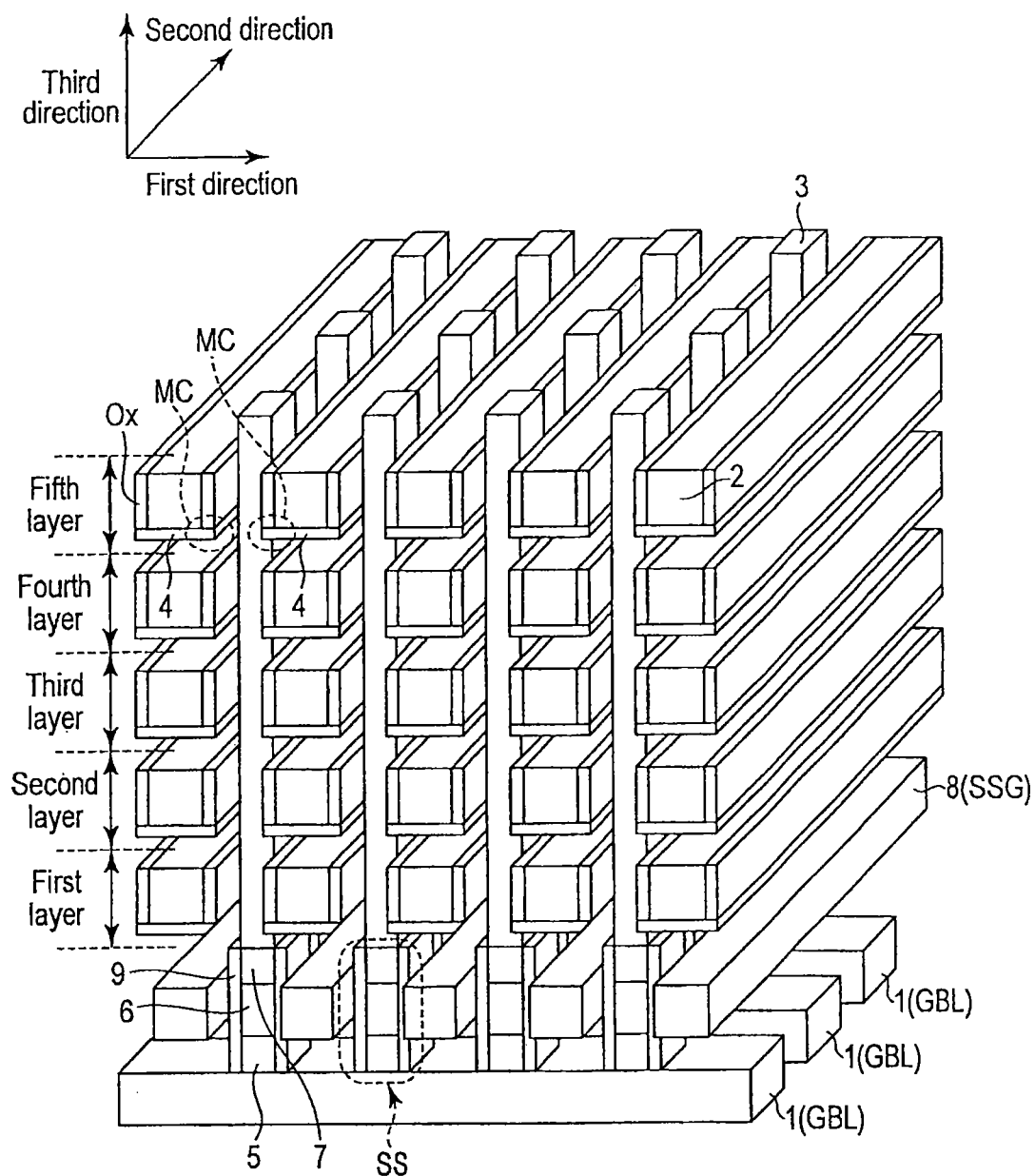

FIGS. 1A and 1B illustrate a memory cell array according to a first embodiment.

In the first embodiment, there is proposed a cell structure in which an insulating layer Ox is disposed, for example, between a row line 2 and a column line 3, and a resistance change material (resistance change element) 4 is disposed on one of first and second surfaces of a row line (for example, a comb-shaped structure as illustrated in FIG. 3) 2 in a third direction (for example, a vertical direction). In this case, for example, an end portion of the resistance change material 4 in a first direction (for example, a horizontal direction in which a global column line 1 extends) contacts with a column line 3. Also, a side surface of the resistance change material and the insulating layer Ox directly contact with the column line 3.

If employing such a structure, a thickness (film thickness) of the resistance change material 4 in the third direction can be set independently of a thickness (film thickness) of the row line 2 in the third direction. Therefore, constraints between an interconnection resistance of the row line 2 and a cross-sectional area of a cell are removed. This is advantageous to increase design degree of freedom. That is, the film thickness of the row line 2 can be made larger than the film thickness of the resistance change material (cell) 4, and the cross-sectional area of the cell (contact area of the resistance change material 4 and the column line 3) can be reduced while lowering the interconnection resistance of the row line 2.

Hereinafter, a detailed structure will be described.

A plurality of global column lines 1, row lines 2, and column lines 3 is provided within the memory cell array. The global column lines 1 are formed in parallel to each other along the first direction respectively, and are disposed in the lowermost layer of the memory cell array. The row lines 2 are formed in parallel to each other along the second direction perpendicular to the first direction respectively, and are provided at positions higher than the global column lines 1. Layers of the row lines 2 (first layer, second layer, third layer, . . . of FIG. 1) are provided plurally in the third direction perpendicular to both the first direction and the second direction (normal direction of a surface on which the global column lines 1 are disposed).

The column lines 3 are formed in parallel to each other between the adjacent row lines 2 along the third direction. A one end (lower end) of the column line 3 is electrically connected to any one of the global column lines 1. More specifically, in a two-dimensional plane formed in the first direction and the second direction, the column lines 3 disposed on the same column along the first direction are electrically connected to the same global column line 1.

An insulating layer Ox is disposed between each of the row lines 2 and the column line 3. The insulating layer Ox may include, for example, an oxide or a nitride of an element in the row line 2.

A memory cell MC including a resistance change element is formed on one of first and second surfaces (for example, upper surface) of each of the row lines 2 in the third direction. For example, in FIG. 1A, the memory cell MC is disposed on the upper surface of each of the row lines 2. In FIG. 1B, the memory cell MC is disposed on the lower surface of each of the row lines 2. Either can be employed, but the former is suitable in terms of a process of forming the resistance change material, a process of separating the resistance change material, and the like.

A selection element (sheet selector) SS is provided between the global column line 1 and the column line corresponding thereto. The selection element SS is, for example, a selection field effect transistor (FET). In this case, the selection element SS includes a source region 5 formed on the global column line 1, a semiconductor layer (channel region) 6 formed on the source region 5, and a drain region 7 formed on the semiconductor layer 6. The semiconductor layer 6 is, for example, a silicon layer.

Also, a selection gate line (selection gate electrode of the selection FET) is formed between adjacent semiconductor layers 6 in the second direction. The selection gate line 8 is disposed in parallel to the row line 2. Moreover, a gate insulating layer 9 is formed between the selection gate line 8 and the semiconductor layer 6.

Also, hereinafter, as in the general MOS memory device, the global column line 1, the row line 2, and the column line 3 will be referred to as a global bit line GBL, a word line WL, and a bit line BL respectively.

FIG. 2 illustrates an example of a partial cross-sectional view and an equivalent circuit of the memory cell array.

FIG. 2 is a partial cross-section of the inside of the plane formed in the first direction and the third direction of FIG. 1A. As illustrated, the source region 5, the channel region 6, and the drain region 7 are sequentially stacked on the global bit line GBL to form the selection element SS. The gate insulating layer 9 is formed on a side surface of the stacked structure.

The selection gate line 8 (SSG) is provided between adjacent channel regions 6 in the second direction. A selection FET (for example, MOS transistor), which is the selection element SS, is formed by the source region 5, the channel region 6, the drain region 7, the gate insulating layer 9, and the selection gate line 8 (SSG).

That is, the selection element SS has two gates connected to different selection gate lines SSG with respect to a set of the source region 5, the channel region 6, and the drain region 7. In other words, two selection FETs are provided per a bit line BL. The selection FETs share the source region 5, the channel region 6, and the drain region 7, but the gates are connected to different selection gate lines SSG. Also, the selection elements SS connected to different bit lines BL and adjacent in the first direction share the gate (selection gate line SSG) with each other.

A pillar-shaped bit line BL is formed on the drain region 7 of each of the selection elements SS. An insulating layer Ox is formed on a side surface of the bit line BL. Moreover, a word line WL is formed in a region between the bit lines BL adjacent in the first direction. For example, a resistance change material 4 functioning as a memory cell MC is formed on an upper surface of the word line WL.

The resistance change material 4 is formed using, for example, AlON as a material such that the resistance change material 4 contacts with the bit line BL and the word line WL. The resistance change material 4 can use a thin film that is made of one of materials including TaON, TiO, TiON, $ZnMn_2O_4$, NiO, AlO, HfO, HfON, TaO, $SrZrO_3$, WO, WON, and $Pr_{0.7}Ca_{0.3}MnO_3$, in addition to AlON.

By the above manner, the memory cell MC including the resistance change material 4 provided between the word line WL and the bit line BL is disposed within the memory cell array, for example, in a three-dimensional matrix form. In the present structure, the word line WL and the bit line BL are line-and-space patterns. The word line WL and the bit line BL have only to intersect with each other in a positional relationship, and it is unnecessary to consider a misalignment in a word line direction and a bit line direction.

Therefore, it is possible to loosen alignment accuracy in the memory cell during manufacture. This makes it possible to easily perform the manufacture. This structure is a highly integrated structure that can store 1-bit information in a $2F^2$ region.

FIG. 3 illustrates an example of a top view of the memory cell array.

FIG. 3 is a layout of the inside of the plane formed in the first direction and the second direction of FIG. 1A, and in particular, a diagram for describing a plane pattern of the word line WL.

That is, FIG. 3 illustrates a layout pattern of any one of a plurality of word lines WL (row lines) stacked in the third direction of FIG. 1A. In FIG. 3, a shaded region represents a layout of the word line WL and a layout of the resistance change material 4.

As illustrated, a layout pattern of a word line WL is commonly connected every other pattern. In other words, the memory cell array includes two sets of word lines WL each having the comb-shaped structure, and regions of the word lines WL on a straight line along the second direction alternately belong to any one of the comb-shaped structures. The layout pattern of the word line WL is stacked with a plurality of layers in the third direction.

Furthermore, the present configuration can also be rephrased as follows.

When the word lines WL are labeled with WL0, WL1, WL2, . . . WL7 in order from the right side of the paper plane of FIG. 3, an electrically equal voltage is applied to odd word lines WL1, WL3, . . . WL7 (or these are commonly connected). On the other hand, an electrically equal voltage is also applied to even word lines WL0, WL2, . . . WL6 (or these are commonly connected). Different voltages may be applied between the odd word lines and the even word lines (or the odd word lines and the even word lines are separated from each other).

Hereinafter, the set of the odd word lines will be referred to as a word line group WLcomb_a, and the set of the even word lines will be referred to as a word line group WLcomb_b. Also, in the case of not distinguishing between the two groups, the two groups will be simply referred to as word line groups WLcomb.

Also, although FIG. 3 illustrates the case of including eight word lines, five global bit lines GBL, and forty-five bit lines BL, this is merely exemplary, and the number of these conductive lines can be appropriately changed.

Figure 4:
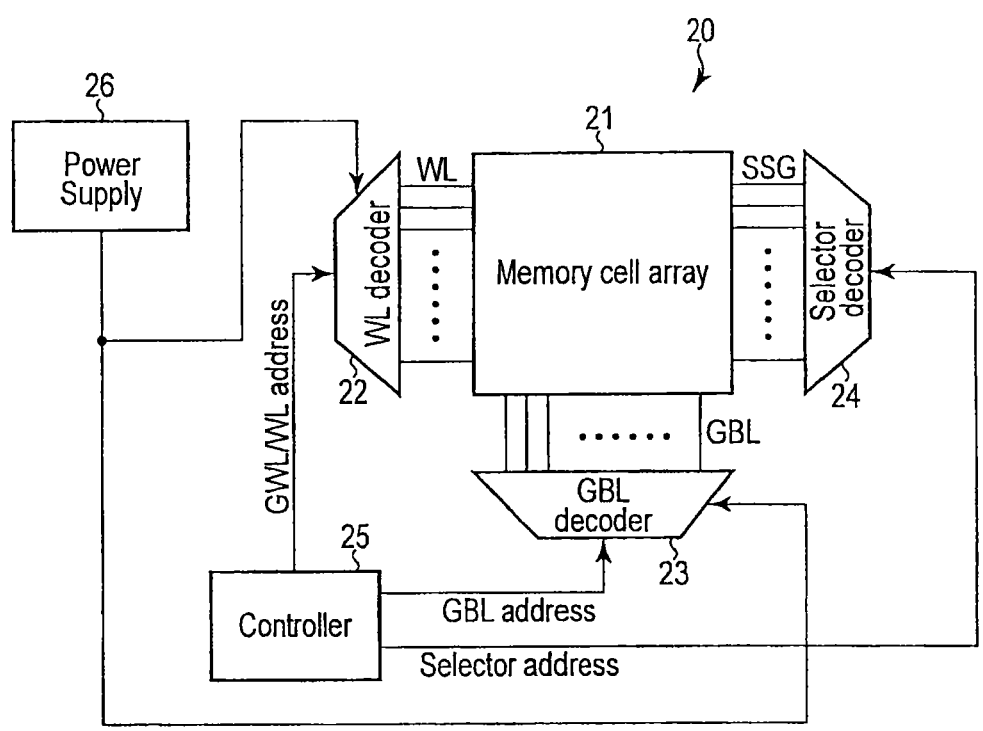
FIG. 4 is an example of a block diagram of a storage device.

FIG. 4 is an example of a block diagram illustrating an overall configuration of a storage device.

The storage device 20 includes a memory cell array 21, a WL decoder 22, a GBL decoder 23, a selector decoder 24, a controller 25, and a power supply 26.

The memory cell array 21 has the configuration described with reference to FIGS. 1A and 2. FIG. 5 is an equivalent circuit of the memory cell array 21. As illustrated in FIG. 5, a memory cell MC including a resistance change element (resistance change material 4 of FIGS. 1A and 2) is disposed in the memory cell array 21. In the memory cell MC, a one end of the resistance change element is connected to any one of the bit lines BL (BL0, BL1, . . . ), and the other end of the resistance change element is connected to any one of the word line groups WLcomb (WLcomb_a, WLcomb_b).

Also, in FIG. 5, the word line groups WLcomb_a and WLcomb_b are denoted by WLcomb_ai and WLcomb_bi respectively, but i represents number of a layer where a corresponding word line group is formed (represents what layer is in order, if the first layer, i=1, if the second layer, i=2, the same hereinafter).

Each of the bit lines BL is connected to the corresponding global bit line GBL through the corresponding selection element SS (SS0, SS1, SS2, . . . ). Furthermore, gates of the adjacent selection elements SS are connected to a common selection gate line SSGj (j is a natural number). The selection element SS may be considered as a group of two selection FETs TR1 and TR2 connected in parallel and commonly having a source and a drain.

A gate of one of the two selection FETs constituting a certain selection element SS (for example, TR1) is shared with a gate of one of the two selection FETs constituting the adjacent selection element SS (for example, TR2).

Also, a gate of the other one of the two selection FETs constituting a certain selection element SS (for example, TR2) is shared with a gate of the other one of the two selection FETs constituting the adjacent selection element SS (for example, TR1).

However, the selection element SS disposed at the endmost portion is configured by only one of the transistor TR1 and the transistor TR2.

The three-dimensional stacked memory cell array of FIG. 1A has a plurality of configurations of FIG. 5.

That is, FIG. 5 corresponds to the illustration of an example of the memory cell array MS included in the two-dimensional plane formed in the first direction and the third direction in FIG. 1A. The memory cell array MS is disposed plurally along the second direction. In this case, the word lines WLcomb_ai, the word lines WLcomb_bi, and the selection gate lines SSGj are commonly connected each other between the memory cell arrays MS. On the contrary, the bit line BL and the global bit line GBL are separated between the memory cell arrays MS.

Returning to FIG. 4, the description will be continued. The WL decoder 22 includes a word line selection unit and a word line driver. The word line selection unit selects a word line WL, based on a WL address received from the controller 25. The word line driver can apply voltages necessary for reading, writing and erasing data to a selected word line and an unselected word line.

The GBL decoder 23 includes a global bit line selection unit and a global bit line driver. The global bit line selection unit selects a global bit line GBL, based on a column address received from the controller 25. The global bit line driver can apply voltages necessary for reading, writing, and erasing data to a selected global bit line and an unselected global bit line.

The selector decoder 24 includes a selector selection unit and a selection gate line driver. The selector selection unit selects a selection gate line SSG, based on a sheet address received from the controller 25. The selection gate line driver can apply voltages necessary for reading, writing, and erasing data to a selected selection gate line and an unselected selection gate line.

Also, the "sheet" represents a group of memory cells selected by any one of the selection gate lines 8. That is, in FIGS. 1A and 1B, the sheet is the group of memory cells existing in the plane formed in the second direction and the third direction.

The controller 25 controls an overall operation of the storage device 20. Also, the controller 25 can transmit a row address to the WL decoder 22, transmit a column address (GBL address) to the GBL decoder 23, and transmit a selector address to the selector decoder 24.

Also, at the time of writing data, the controller 25 can instruct the WL decoder 22, the GBL decoder 23, and the selector decoder 24 to apply a voltages so as to change a resistance state of a resistance change element of a selected memory cell MC.

At the time of reading data, the controller 25 can instruct the WL decoder 22, the GBL decoder 23, and the selector decoder 24 to apply voltages so as to detect a resistance value of a resistance change element of a selected memory cell MC as a storage state of the corresponding memory cell MC.

Moreover, the controller 25 includes a sense amplifier and can sense (amplify) data read in the global bit line GBL by the sense amplifier.

The power supply 26 generates predetermined voltages for reading, writing, and erasing data. The voltages generated by the power supply 26 are applied to the word line WL and the bit line BL.

For example, when writing data, a large voltage difference is generated between a selected word line and a selected bit line, and a resistance state of a resistance change element is switched. Also, when reading data, a voltage difference can be generated between a selected word line and a selected bit line in a range where a transition of a resistance state does not occur, and a current flowing through the bit line or the word line can be detected.

Figures 6, 7:
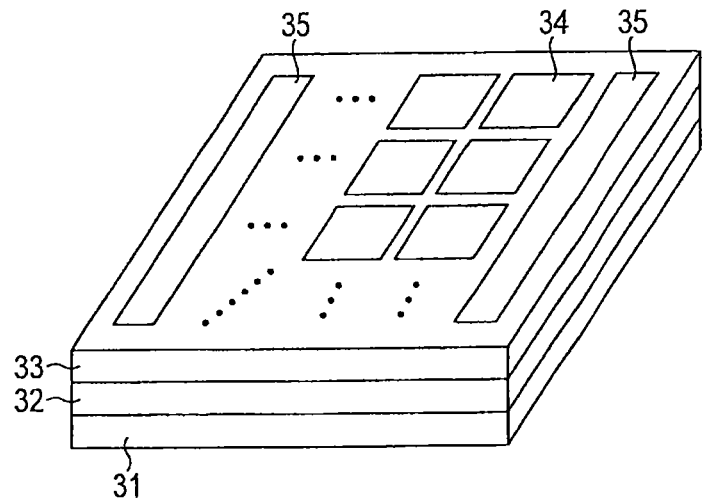
FIG. 6 is an example of an external view of a storage device.
FIG. 7 is an example of a diagram illustrating a bias relationship in an operation of the storage device.

FIG. 6 is an example of an outer appearance of the storage device.

A CMOS circuit 32 including an interconnection layer is formed on a semiconductor substrate (for example, silicon substrate) 31 by a commonly used process. A layer 33 including a plurality of memory cell units 34 is formed on the CMOS circuit 32. Each of the memory cell units 34 of FIG. 6 corresponds to the memory cell array of FIGS. 1A and 1B, and a wiring is formed based on, for example, a 20-nm design rule. Also, in a general memory including the decoders 22 to 24 and the controller 25 of FIG. 4, a portion called a peripheral circuit is included in the CMOS circuit 32 of FIG. 6.

Also, with the exception of the connection portion to the memory cell unit 34, the CMOS circuit 32 may be designed and manufactured based on, for example, a 100-nm design rule, which is looser than the memory cell unit 34. The layer 33 includes an electrical connection portion for the CMOS circuit 32 around each of the memory cell units 34. Blocks based on units of the memory cell unit 34 and the connection portion are disposed in a matrix form.

Furthermore, a through-hole is formed in the layer 33. An input/output unit 35 of the present device, including a terminal electrically connected to an input/output unit of the CMOS circuit 32 through the through-hole, can be formed in, for example, an end portion of the layer 33.

On the other hand, since the memory cell unit 34 and the CMOS circuit 32 are connected in a vertical direction to a substrate surface, an operating time can be reduced or the number of cells capable of being read and written at the same time can be significantly increased, without increase in a chip area.

Also, an I/O pad is formed in the input/output unit 35 of the device and can be bonded to a lead frame in a package process.

Figure 8:
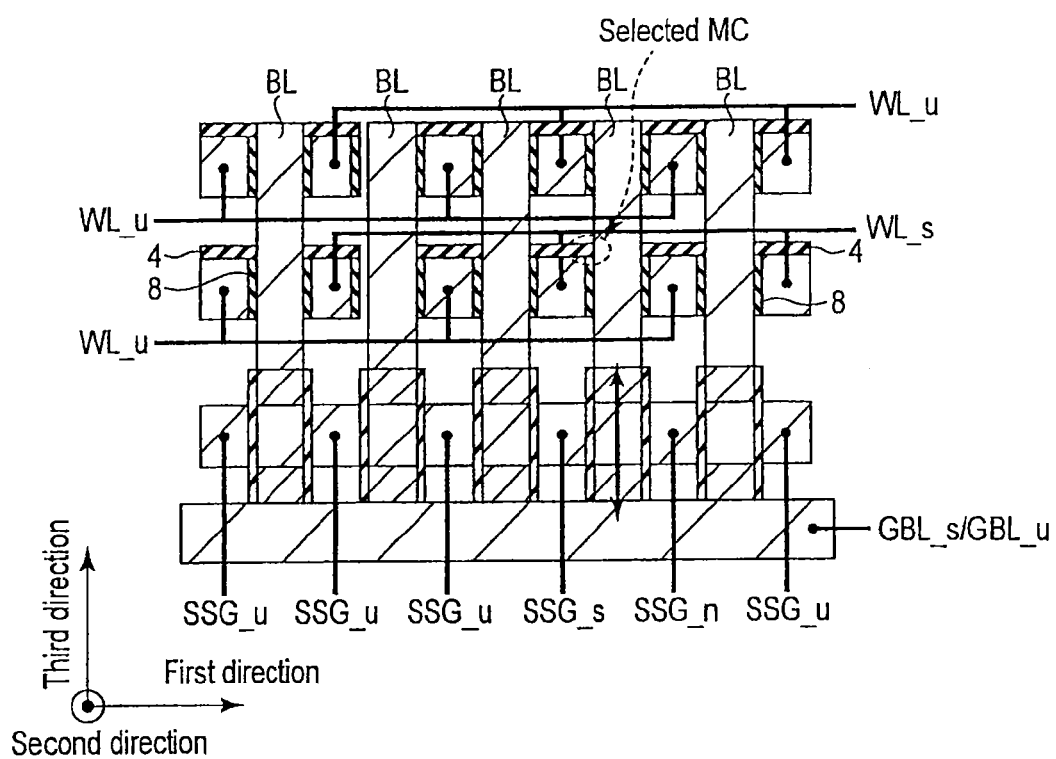
FIG. 8 is an example of a cross-sectional view of the memory cell array.

FIG. 7 illustrates an example of a bias relationship in the operation of the storage device. FIG. 8 is an example of a cross-sectional view of the memory cell array and illustrates the plane formed in the first direction and the third direction in FIG. 1A.

In the following description, among global bit lines GBL, a selected global bit line is labeled with GBL_s, and an unselected global bit line is labeled with GBL_u. Also, among word lines WL, a selected word line is labeled with WL_s, and an unselected word line is labeled with WL_u.

Furthermore, among selection gate lines SSG, two selection elements SS corresponding to a bit line BL, to which a selected memory cell MC is connected, are selected and labeled with SSG_s and SSG_n. The other selection gate lines SSG are considered as unselected, and are labeled with SSG_u.

First, a set operation, that is, a write operation of storing information in a memory cell, will be described.

In a write operation, the GBL decoder 23 applies a write voltage Vw (>0 V) to the selected global bit line GBL_s, and applies Vwf, for example, a half of the write voltage (Vw/2), to the unselected global bit line GBL_u.

Also, the WL decoder 22 applies 0 V to the selected word line WL_s, and applies Vwf, for example, (Vw/2), to the unselected word line WL_u.

Furthermore, the selector decoder 24 applies a write gate voltage Vg_w (>0 V) to both of the two selection gate lines SSG_s and SSG_n, and applies 0 V to the other selection gate lines SSG_u.

As a result, in the selection element SS connected to the selected bit line BL, a channel is formed by the two selection gate lines SSG_s and SSG_n, and the write voltage Vw is transferred from GBL_s to the selected memory cell MC. On the other hand, 0 V is transferred from WL_s to the selected memory cell MC.

Therefore, data is written to the memory cell MC by applying a voltage difference of Vw to both terminals of the resistance change element of the memory cell MC.

Next, a reset operation, that is, an operation of erasing information retained in the memory cell, will be described with reference to FIGS. 7 and 8.

In an erase operation, considering that the element performs a bipolar operation, the WL decoder 22 applies Ves+Vof, for example, a voltage (Ve+1) obtained by adding an offset voltage Vof (=1 V) to an erase voltage Ve (=Ves), to the selected word line WL_s, and applies Vef+Vof, for example, a voltage ((Ve/2)+1) obtained by adding the offset voltage Vof to a half of the erase voltage Ve (=Vef), to the unselected word line WL_u.

Also, the GBL decoder 23 applies an offset voltage of 1 V to the selected global bit line GBL_s, and applies Vef+Vof, for example, ((Ve/2)+1), to the unselected global bit line GBL_u.

Furthermore, the selector decoder 24 applies an erase gate voltage Vg_e to both of the selection gate lines SSG_s and SSG_n, and applies 0 V to the other selection gate lines SSG_u.

As a result, as described at the time of the writing, the voltage Ve is transferred to the selected memory cell MC. Data is erased by applying a voltage difference of Ve to both terminals of the resistance change element.

Herein, the reason why the offset voltage Vof of about 1 V is input to the global bit line and the word line is as follows: due to characteristics of the selection element to be described below, it is possible to significantly reduce a leakage current to the unselected memory cell by setting the voltage of the selected global bit line GBL_s to be about 1 V higher than the unselected selection gate line SSG_u, and technique for raising the entire voltages of the global bit line and the word line is effective to provide a predetermined voltage difference by avoiding a negative voltage circuit, whose required circuit area is relatively large.

Next, an operation of reading information from the memory cell will be described with reference to FIGS. 7 and 8.

In a read operation, the GBL decoder 23 applies a voltage (Vr+Vo), which is obtained by adding an offset voltage Vo to a read voltage Vr, to the selected global bit line GBL_s and the unselected global bit line GBL_u.

Also, the WL decoder 22 applies the offset voltage Vo to the selected word line WL_s, and applies (Vr+Vo) to the unselected word line WL_u.

Furthermore, the selector decoder 24 applies a read gate voltage Vg_r to one of the selection gate lines SSG_s and SSG_n, applies 0 V to the other, and applies 0 V to the remaining selection gate lines SSG_u.

As a result, as described at the time of the writing, the voltage Vr is transferred to the selected memory cell MC through the selected bit line BL. Herein, a current flowing through the selected memory cell MC is different by the resistance state (HRS or LRS) of the selected memory cell MC. For example, data stored in the selected memory cell MC is determined by detecting the current value in the sense amplifier connected to the selected global bit line GBL_s.

Also, generally, for the selected word lines WLs, only one word line is selected per a memory cell array; however, for the selected global bit lines GBLs, a plurality of global bit lines may be selected at the same time. Therefore, simultaneously, a bandwidth can be improved due to an increase in the number of bits on which writing, erasing, and reading can be performed.

Next, a forming operation of initializing the resistance value of the memory cell will be described.

In a forming operation, the WL decoder 22 applies Vfs+Vof to the selected word line WL_s, and applies Vff+Vof to the unselected word line WL_u. Herein, for example, Vfs>Vff, and Vof is an offset voltage, for example, 1 V.

Also, the GBL decoder 23 applies, for example, 1 V to the selected global bit line GBL_s as the offset voltage Vof, and applies Vff+Vof to the unselected global bit line GBL_u.

Furthermore, the selector decoder 24 applies Vg1_f to the selection gate line SSG_s, applies Vg2_f to the selection gate line SSG_n, and applies 0 V to the other selection gate lines SSG_u.

As a result, a high voltage difference is applied to the selected memory cell MC, and a forming operation of the selected memory cell MC is performed.

Herein, the reason why the offset voltage Vof of about 1 V is input to the global bit line and the word line is as follows: due to characteristics of the selection element to be described below, it is possible to improve cutoff characteristic of the selection element SS connected to the unselected selection gate line SSG_u by setting the voltage of the selected global bit line GBL_s to be about 1 V higher than the unselected selection gate line SSG_u. As a result, it is possible to significantly reduce a leakage current to the unselected memory cell, and technique for raising the entire voltages of the global bit line and the word line is effective to provide a predetermined voltage difference by avoiding a negative voltage circuit, whose required circuit area is relatively large.

Next, a method of manufacturing a storage device according to a first embodiment will be described.

FIGS. 9 to 20 illustrate each process of the method of manufacturing the storage device.

First, for example, a general CMOS circuit, which controls an operation of a ReRAM, is formed on a silicon substrate. Subsequently, an interlayer insulating layer is formed on the silicon substrate to cover the CMOS circuit. The following manufacturing method relates to a structure over the interlayer insulating layer.

Figure 9:
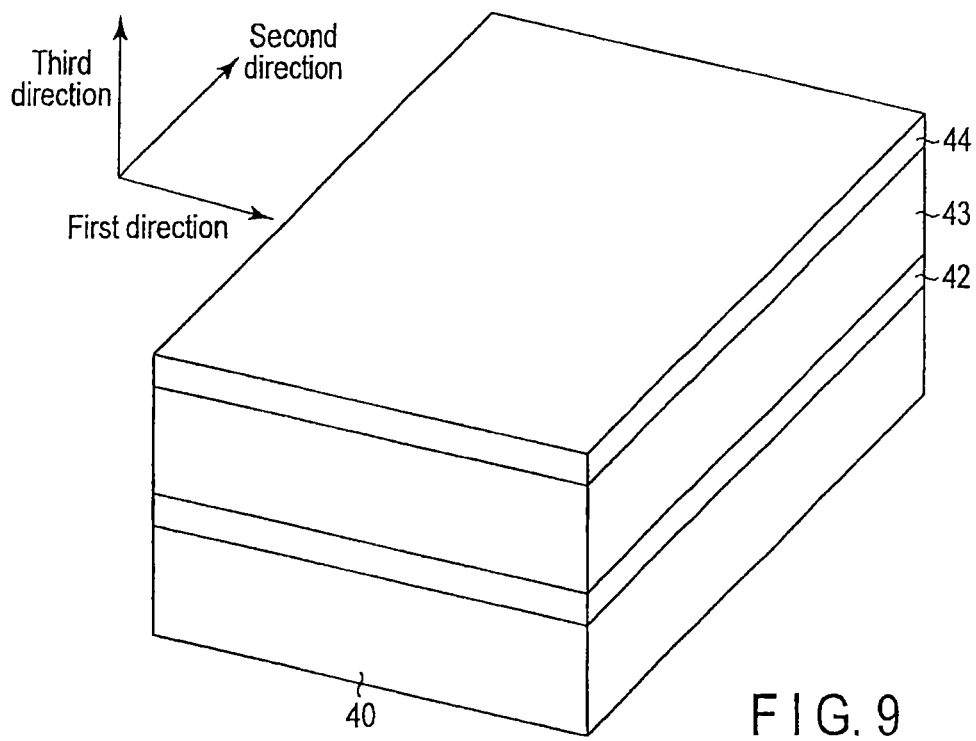

First, as illustrated in FIG. 9, a global bit line film 40 is formed on the interlayer insulating layer. The global bit line film corresponds to the global bit line GBL described with reference to FIGS. 1A and 1B. As an example, the global bit line film 40 is formed using tungsten (W) and a TiN film as a barrier metal.

Subsequently, an $n^+$ type silicon layer 42, a $p^-$ type silicon layer 43, and an $n^+$ type silicon layer 44 are sequentially formed on the global bit line film 40. The silicon layers 42 to 44 correspond to the source region 5, the channel region 6, and the drain region 7 respectively, which have been described with reference to FIGS. 1A and 1B.

The silicon layers 42 and 44 have an impurity concentration of, for example, about $1\times10^{20}$ cm$^{-3}$, and a film thickness of, for example, about 40 nm. The silicon layer 43 has an impurity concentration of, for example, about $1\times10^{18}$ cm$^{-3}$, and a film thickness of, for example, about 120 nm. Subsequently, an annealing is performed under the condition of, for example, about 750° C. and 60 seconds, to crystallize the silicon layers 42 to 44.

Figure 10:
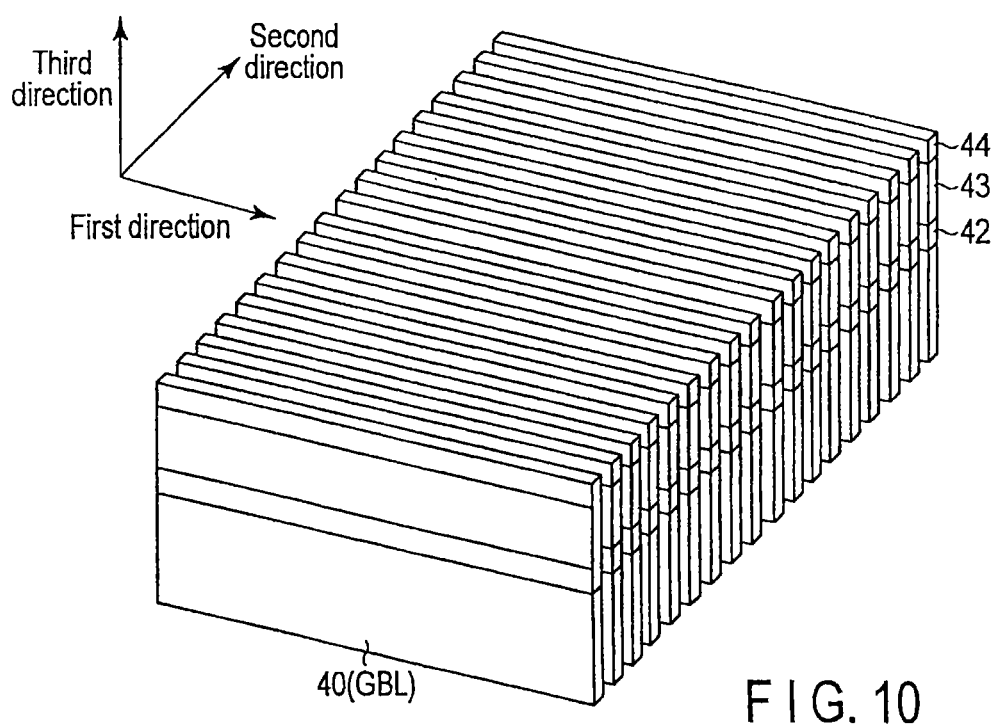

Subsequently, as illustrated in FIG. 10, the silicon layers 42 to 44 and the global bit line film 40 are patterned by a photolithography technique and an RIE technique. In this manner, a global bit line 40 (GBL) having a stripe shape extending in a first direction is formed. Also, a line width and an adjacent spacing of the global bit line GBL are, for example, about 20 nm, a film thickness thereof is, for example, about 150 nm, and a sheet resistance thereof is, for example, about 1.5 ohm.

Figure 11:
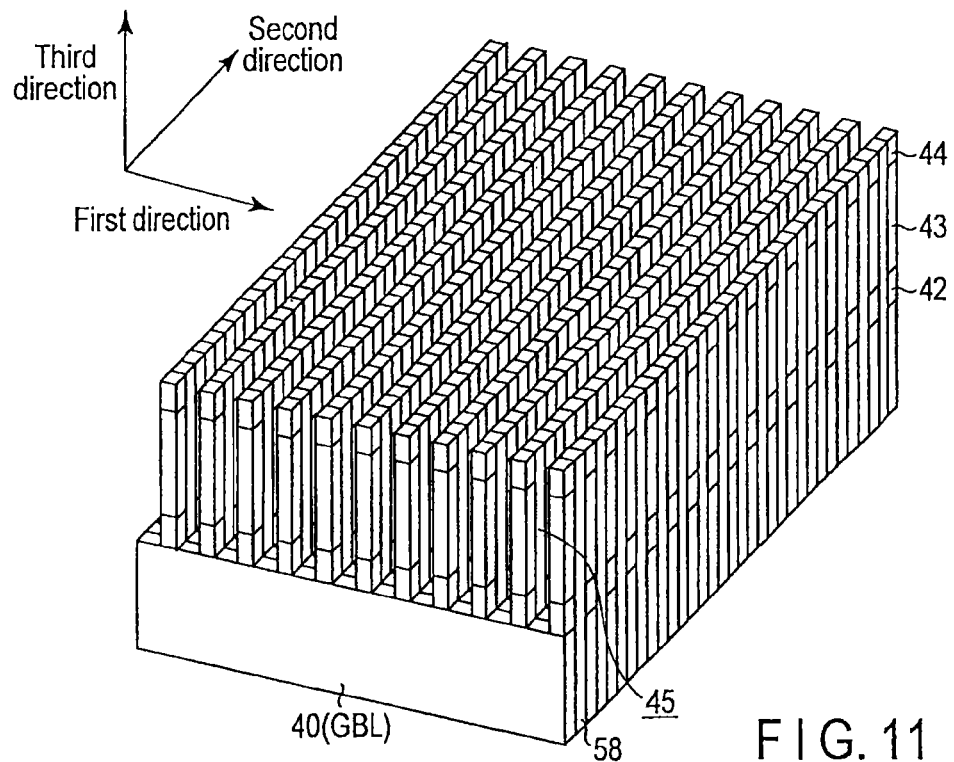

Subsequently, as illustrated in FIG. 11, an interlayer insulating layer 58 is formed on an entire surface. Subsequently, the interlayer insulating layer 58 is polished by a CMP method or the like, and an upper surface of the silicon layer 44 is exposed. By the present process, a recess portion formed in the process of FIG. 10 is filled with the interlayer insulating layer 58. Also, the silicon layers 42 and 43 and the interlayer insulating layer 58 are patterned in a stripe shape extending a second direction by using a photolithography technique and an RIE technique.

As a result of the present process, the silicon layers 42 and 43 are separated from each selection element SS. Also, the patterning process is performed, for example, under the condition that a line width is about 15 nm and an adjacent spacing is about 25 nm (a half pitch is 20 nm). At a bottom of a recess 45 formed by the present process, the global bit line 40 and the interlayer insulating layer 58 are exposed.

Figure 12:
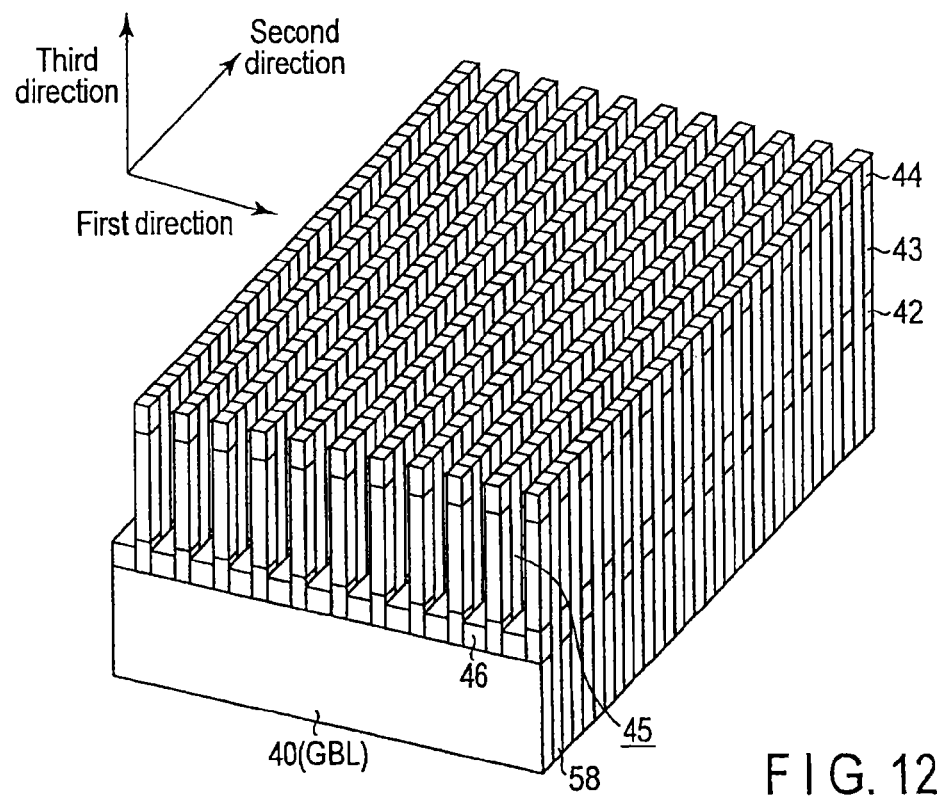

Subsequently, as illustrated in FIG. 12, an insulating layer 46 (for example, a silicon oxide film) is formed on an entire surface. Subsequently, the insulating layer 46 is etched backed so that the insulating layer 46 remains only at the bottom of the recess 45. A film thickness of the remaining insulating layer 46 is, for example, about 30 nm. Therefore, a part of the silicon layer 42 and side surfaces of the silicon layers 43 and 44 are exposed in the inside of the recess 45.

Figure 13:
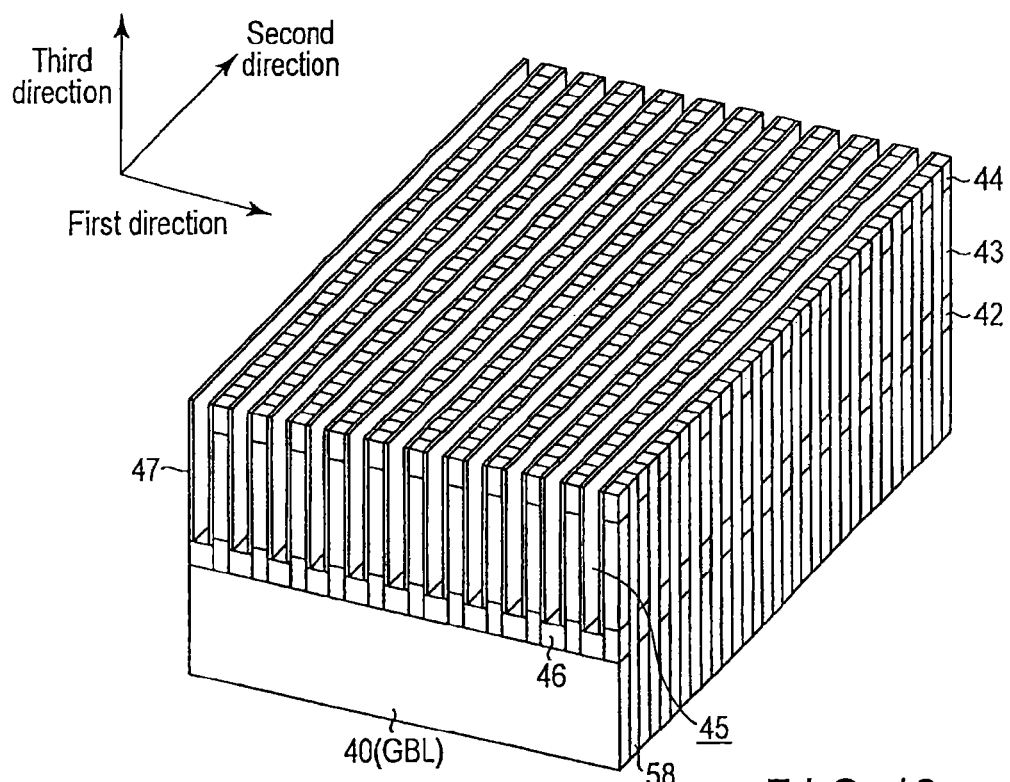

Subsequently, as illustrated in FIG. 13, an interlayer insulating layer 47 is formed on an entire surface. The insulating layer 47 corresponds to the gate insulating layer 9 described with reference to FIGS. 1A and 1B. Subsequently, the upper surface of the silicon layer 44 and the insulating layer 47 on the insulating layer 46 are removed so that the insulating layer 47 remains only at the side surface of the recess 45.

Figure 14:
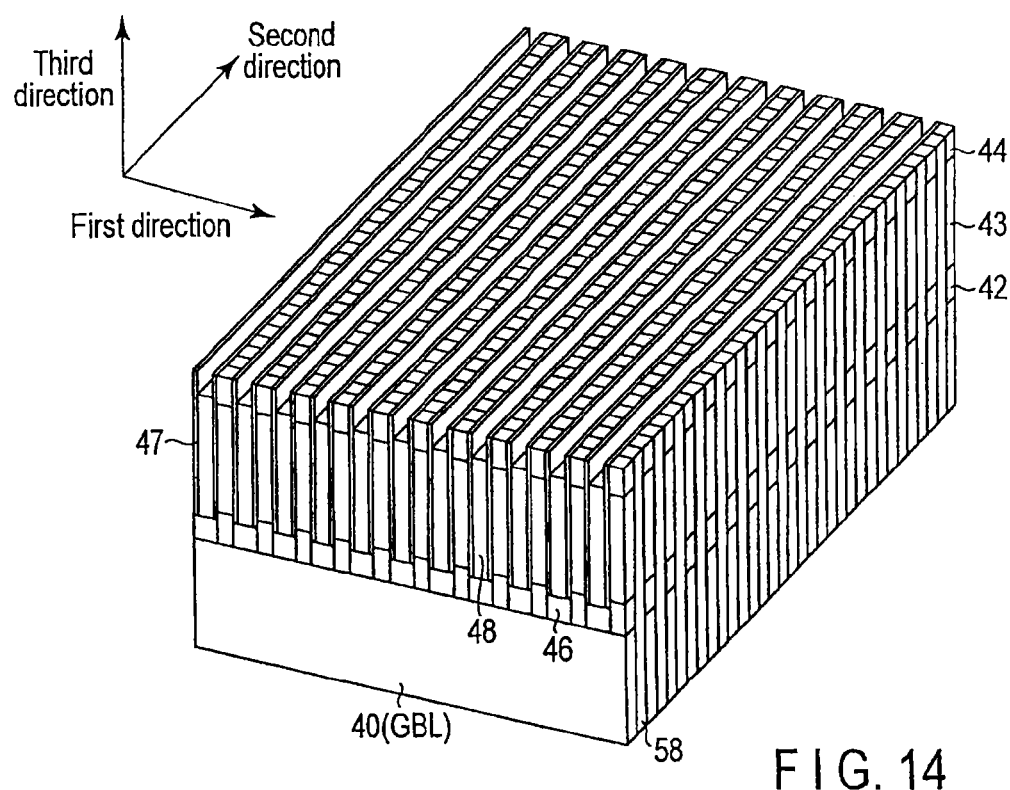

Subsequently, as illustrated in FIG. 14, the inside of the recess 45 is filled with a conductive film 48. The conductive film 48 is, for example, an $n^+$ type polycrystalline silicon layer, and corresponds to the selection gate line SSG described with reference to FIGS. 1A and 1B. Subsequently, an upper surface of the conductive film 48 is etched back so that a film thickness of the conductive film 48 becomes, for example, about 140 nm.

By the present process, a lower surface of the conductive film 48 becomes lower than an interface of the silicon layers 42 and 43, and an upper surface of the conductive film 48 becomes higher than an interface of the silicon layers 43 and 44.

Subsequently, as illustrated in FIG. 15, an insulating layer 49 (for example, a silicon oxide film) is formed on an entire surface. Subsequently, the insulating layer 49 is polished by, for example, a CMP method, so that the insulating layer 49 remains only within the recess 45. As a result, the upper surface of the silicon layer 44 is exposed.

Figure 16:
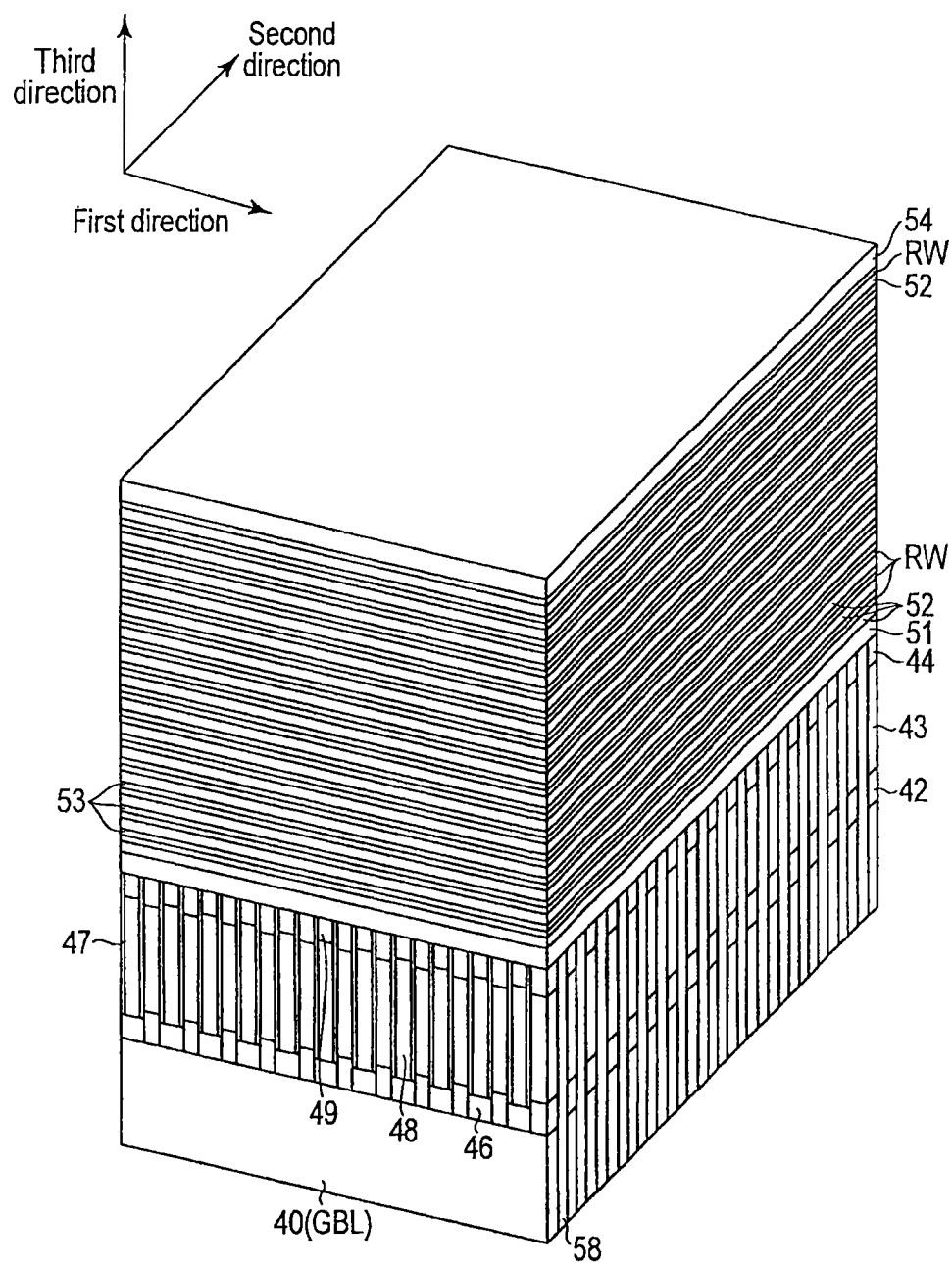

Next, as illustrated in FIG. 16, an insulating layer 51 (for example, a silicon oxide film) having a film thickness of, for example, 20 nm, is formed on the silicon layer 44 and the insulating layers 49 and 58. Subsequently, sixteen stacked layer units, each of which includes a word line film 52, a resistance change material film RW, and an insulating layer 53, are formed on the insulating layer 51. The word line film 52 in each of the stacked layer units corresponds to the word line WL described with reference to FIGS. 1A and 1B, and the resistance change material film RW corresponds to the resistance change material (cell) 4 described with reference to FIGS. 1A and 1B.

Also, the word line film 52 is formed using, for example, TiN as a material, and a film thickness thereof is, for example, about 10 nm. Also, the resistance change material film RW is formed using, for example, AlON, as a material, and a film thickness thereof is, for example, about 4 nm. Also, the insulating layer 53 is formed using, for example, $SiO_2$ as a material, and a film thickness thereof is, for example, about 7 nm.

Herein, the resistance change material film RW is, for example, an oxynitride film that is formed to a film thickness of about 4 nm by an atomic layer deposition (ALD) method. Also, the resistance change material film RW may be an oxide film, a nitride film, or an oxynitride film that is formed by a plasma oxidation process, a plasma nitridation process, or a plasma oxynitridation process.

Subsequently, an insulating layer (for example, $SiO_2$) 54 having a film thickness of, for example, 13 nm, is formed on the word line film 52 of the uppermost layer (sixteenth layer in this example).

Figure 17:
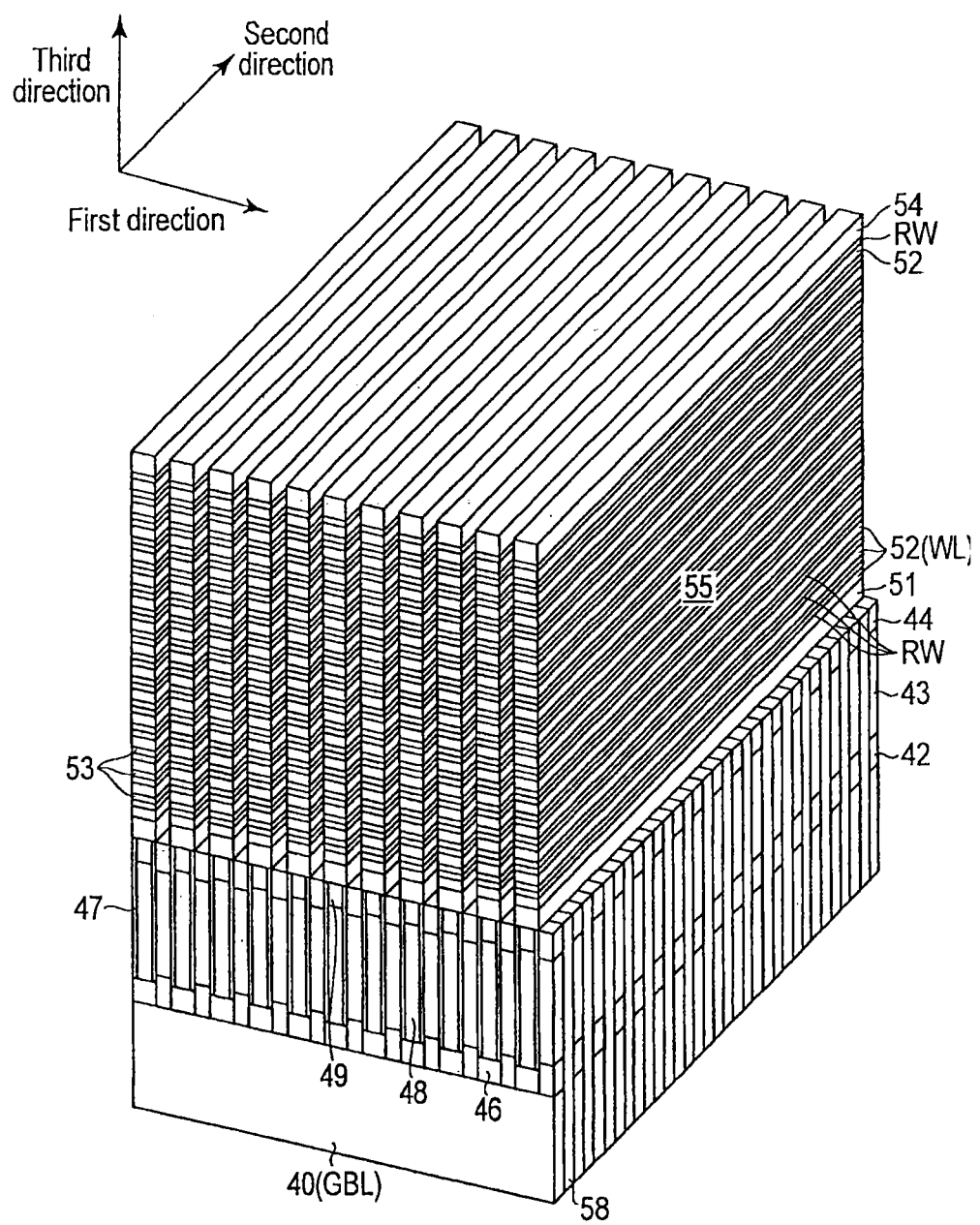

Subsequently, as illustrated in FIG. 17, the insulating layers 54, 53 and 51, the resistance change material film RW, and the word line film 52 are patterned in a stripe shape along a second direction by a photolithography technique and an RIE technique. The present patterning process is performed, for example, under the condition that a line width is about 20 nm and an adjacent spacing is about 20 nm (a half pitch is 20 nm).

Also, the present process is performed such that the insulating layers 54, 53 and 51, the resistance change material film RW, and the word line film 52 remain on the underlying insulating layer 49. As a result of the present process, the word line WL is formed, and simultaneously, the upper surfaces of the silicon layer 44 and the insulating layers 58 and 47 are exposed at the bottom of the recess 55 formed by the patterning.

Subsequently, as illustrated in FIG. 18, an insulating layer (for example, an oxide layer) Ox is selectively formed on the side surface of the word line WL in the first direction. The insulating layer Ox corresponds to the insulating layer Ox described with reference to FIGS. 1A and 1B. The insulating layer Ox, for example, is formed to a film thickness of about 4 nm by a plasma oxidation process, and the insulating layer Ox is formed such that the inside of the recess 55 is not filled.

Also, the insulating layer Ox may be a nitride layer that is formed by a plasma nitridation process. In any case, the insulating layer Ox is formed by oxidizing or nitriding the word line WL. As a result, the insulating layer Ox includes an oxide or a nitride of an element in the word line WL.

Figure 19:
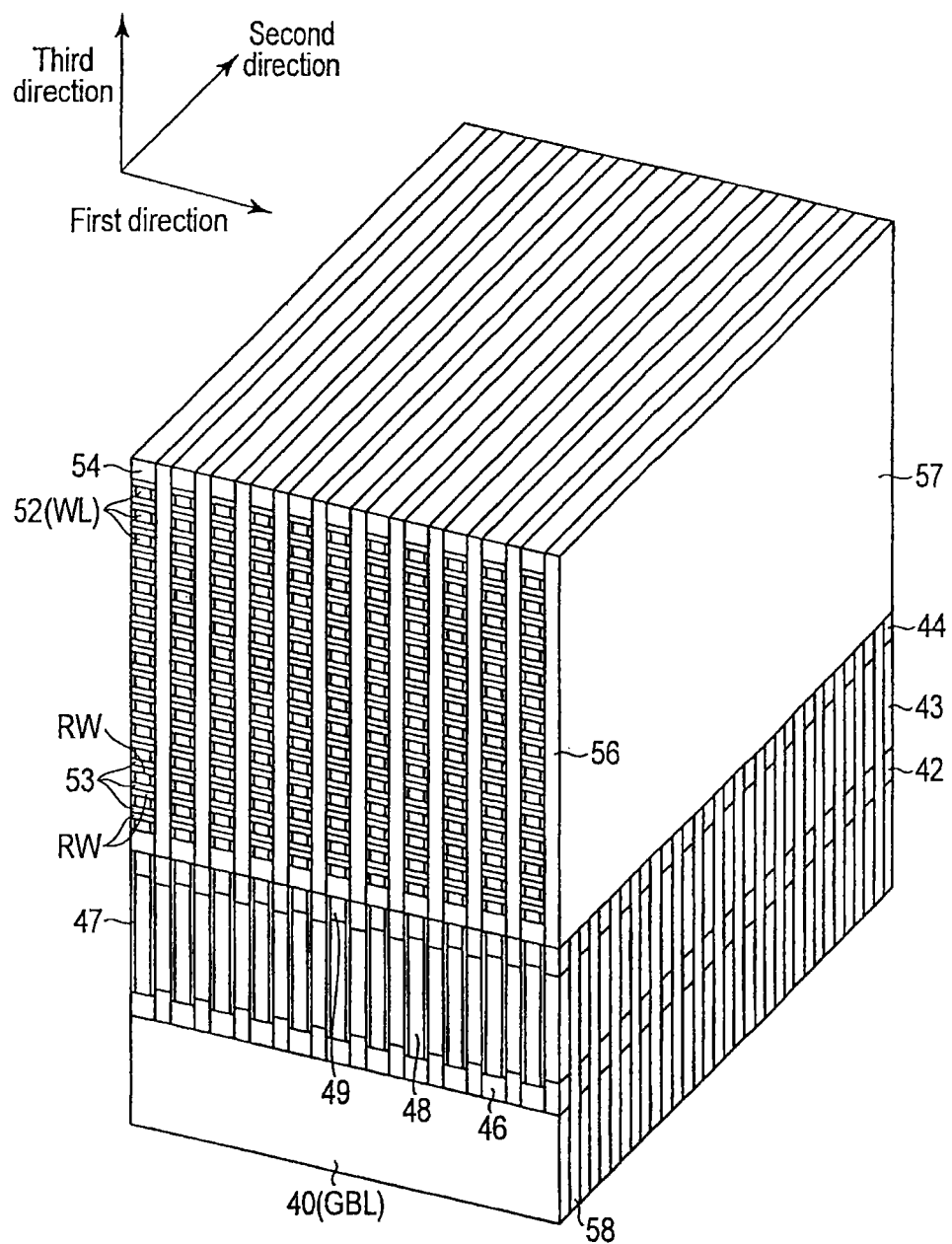

Subsequently, as illustrated in FIG. 19, a bit line film 57 is formed on an entire surface and is polished by a CMP method so that the bit line film 57 remains only within the recess 55. The bit line film 57 corresponds to the bit line BL described with reference to FIGS. 1A and 1B, and is formed using, for example, $n^+$ type polycrystalline silicon as a material. Herein, the side surface of the resistance change film RW and the oxide layer Ox directly contact with the bit line film 57.

Figure 20:
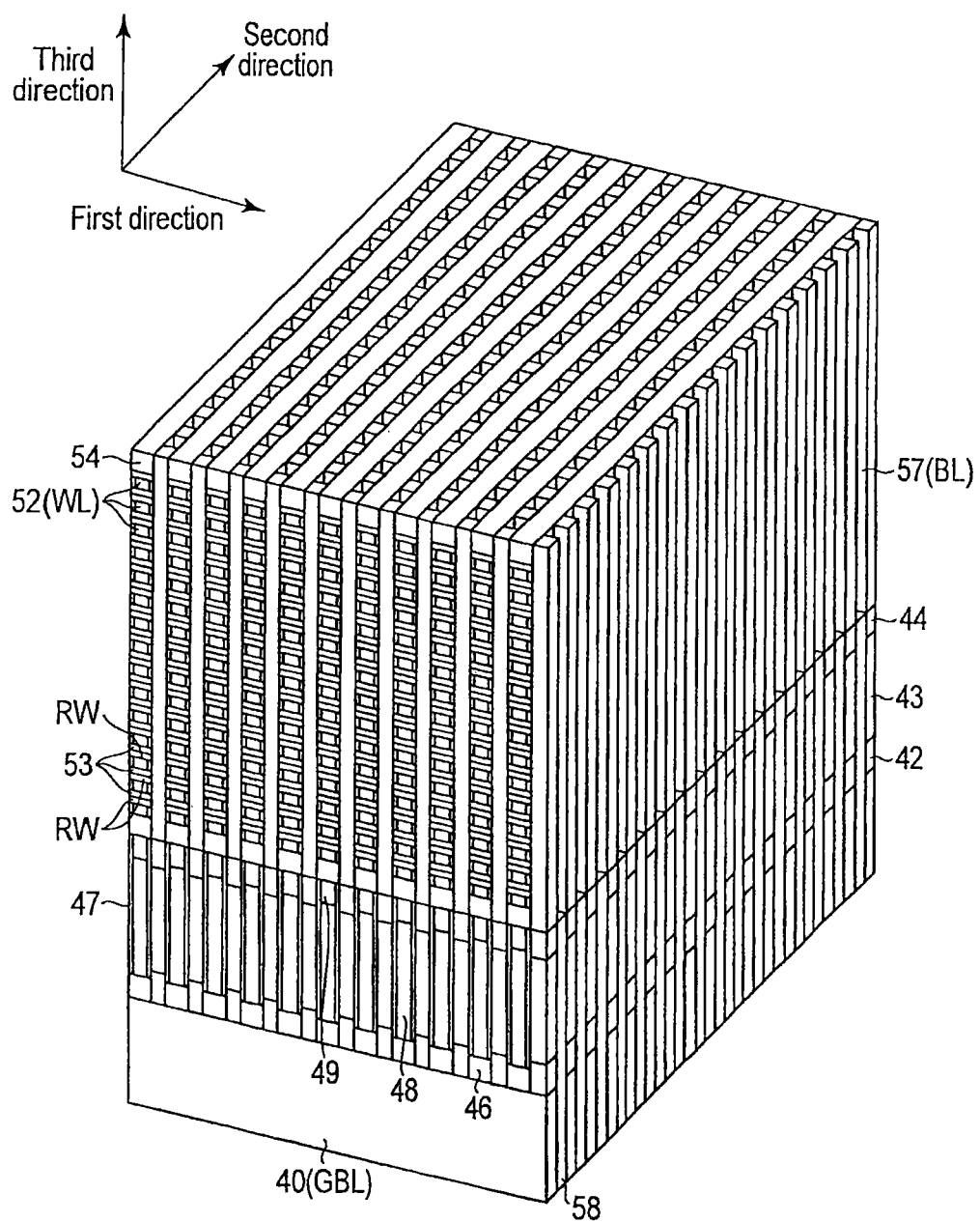

Subsequently, as illustrated in FIG. 20, the bit line film 57 is patterned in a pillar shape by using a photolithography technique and an RIE technique.

The present patterning process is performed, for example, under the condition that a line width and an adjacent spacing are all about 20 nm. Also, the present process is performed such that the bit line film 57 remains on the underlying silicon layer 44. As a result of the present process, a bit line BL is completed.

Subsequently, a recess between adjacent bit lines BL is filled with an interlayer insulating layer, and a memory cell region R1 is completed. Subsequently, as in a typical semiconductor device, a passivation process is performed, and an interconnection connecting portion, which will be an input/output unit, is further formed. Finally, the above-described storage device is completed by performing a so-called post-process, such as an inspection, a dicing, or the like.

Herein, there is a case where a distance between the row lines 2 in the third direction is shortened (resistance is reduced), a case where a length of the row line 2 in the second direction is lengthened, or a case where the number of parallel connections of the row line 2 in the third direction is increased as the number of parallels in the first direction is increased. In these cases, the influence of the leakage current at the time of the forming is increased. However, in the first embodiment, the resistance change materials 4 are separated from each other between the row lines 2 in the third direction. As a result, a leakage current at the time of the forming can be reduced, and an interference between the memory cells can be reduced. Also, an interference between the memory cells can also be reduced during the write, erase, and read operations as well as at the time of the forming.

2. Second Embodiment

Figure 21:
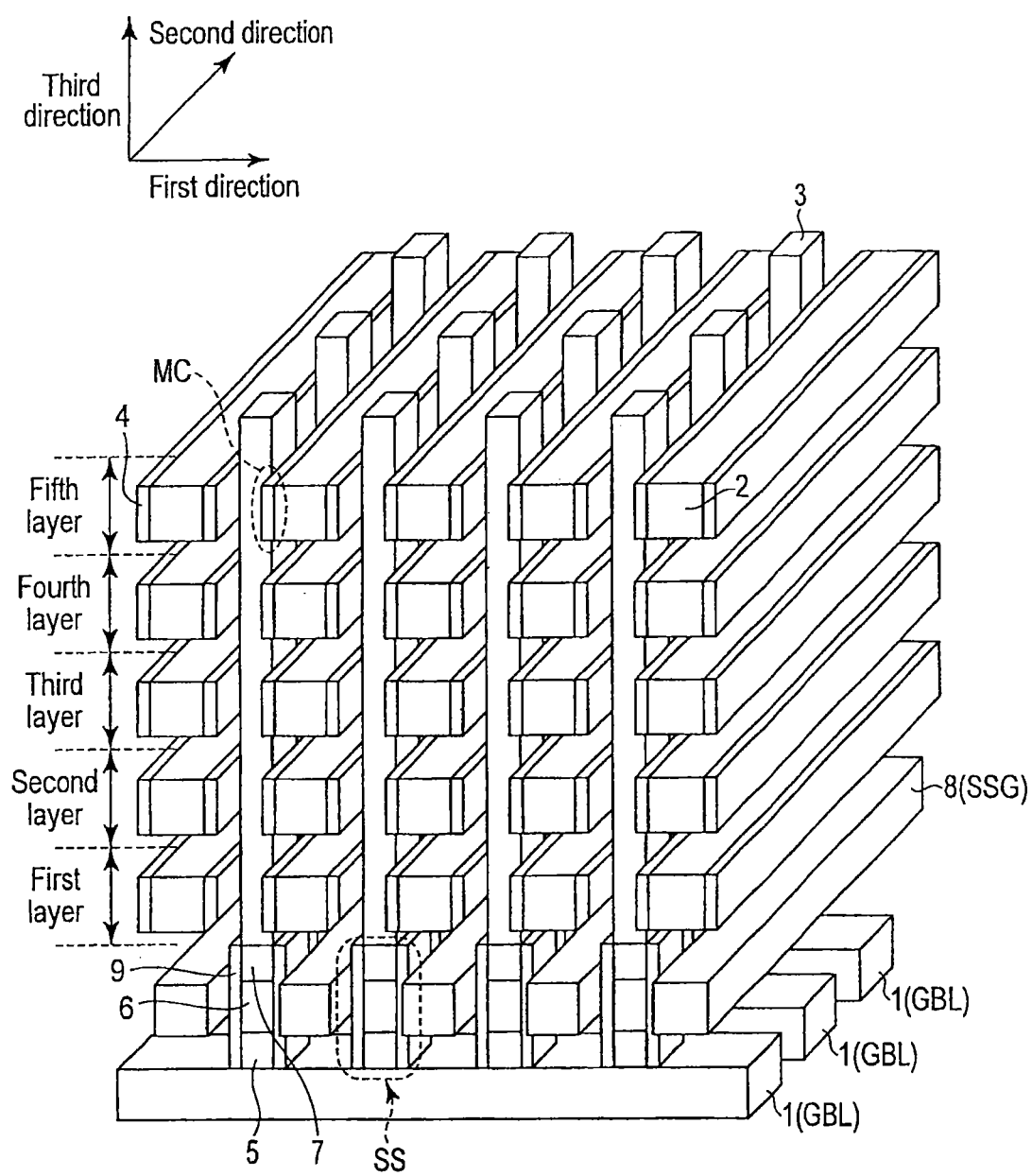
FIG. 21 is an example of a perspective view of a memory cell array according to a second embodiment.

FIG. 21 illustrates a memory cell array according to a second embodiment.

In the second embodiment, there is proposed a cell structure in which resistance change materials (resistance change elements) 4 are disposed, for example, between row lines 2 and column lines 3, and the resistance change materials 4 are separated from each other between upper and lower row lines 2. Also, in the present example, for example, the resistance change material 4 extends in a second direction (for example, a direction in which the row line 2 extends). Therefore, the resistance change material 4 contacts between the row line 2 and the left and right column lines 3.

If employing such a structure, even though an initial resistance of the resistance change material 4 is low, the resistance change material 4 is separated between the upper and lower row lines 2. Thus, for example, at the time of the forming, the leakage current generated between the upper and lower row lines 2 can be suppressed, and the interference between the memory cells can be reduced.

Herein, the resistance change materials 4 are separated from each other between the row lines 2 in a third direction because an influence of the leakage current at the time of the forming is increased in a case where a distance of the row lines 2 in the third direction is shortened (resistance is reduced), a case where a length of the row line 2 in the second direction is lengthened, or a case where the number of parallel connections of the row line 2 in the third direction is increased as the number of parallels in the first direction is increased. Also, the interference between the memory cells can also be reduced during the write, erase, and read operations as well as at the time of the forming.

Hereinafter, a detailed structure will be described.

A plurality of global column lines 1, row lines 2, and column lines 3 is provided within a memory cell array. The global column lines 1 are formed in parallel to each other along the first direction and are disposed in the lowermost layer of the memory cell array. The row lines 2 are formed in parallel to each other along the second direction perpendicular to the first direction respectively, and are provided at positions higher than the global column lines 1. Layers of the row lines 2 (first layer, second layer, third layer, . . . of FIG. 1) are provided plurally in the third direction perpendicular to both the first direction and the second direction (normal direction of a surface on which the global column lines 1 are disposed).

The column lines 3 are formed in parallel to each other between the adjacent row lines 2 along the third direction. A one end (lower end) of the column line 3 is electrically connected to any one of the global column lines 1. More specifically, in a two-dimensional plane formed in the first direction and the second direction, the column lines 3 disposed on the same column along the first direction are electrically connected to the same global column line 1.

A memory cell MC including a resistance change element is disposed between each row line 2 and each column line 3. The resistance change element (resistance change material 4) in the memory cell MC includes, for example, an oxide or a nitride of an element in the row line 2. The resistance change materials 4 are disposed at side surfaces of the row lines 2 in the first direction and extend along the row lines 2 in the second direction.

That is, the resistance change materials 4 are separated from each other between the row lines 2 in the third direction, but are connected to each other between the adjacent column lines 3 in the second direction. Herein, it can be said that the resistance change materials 4 are separated from each other in the third direction and extend continuously in the second direction.

Since parts other than those described above are identical to the first embodiment, a description thereof will be omitted.

Figure 22:
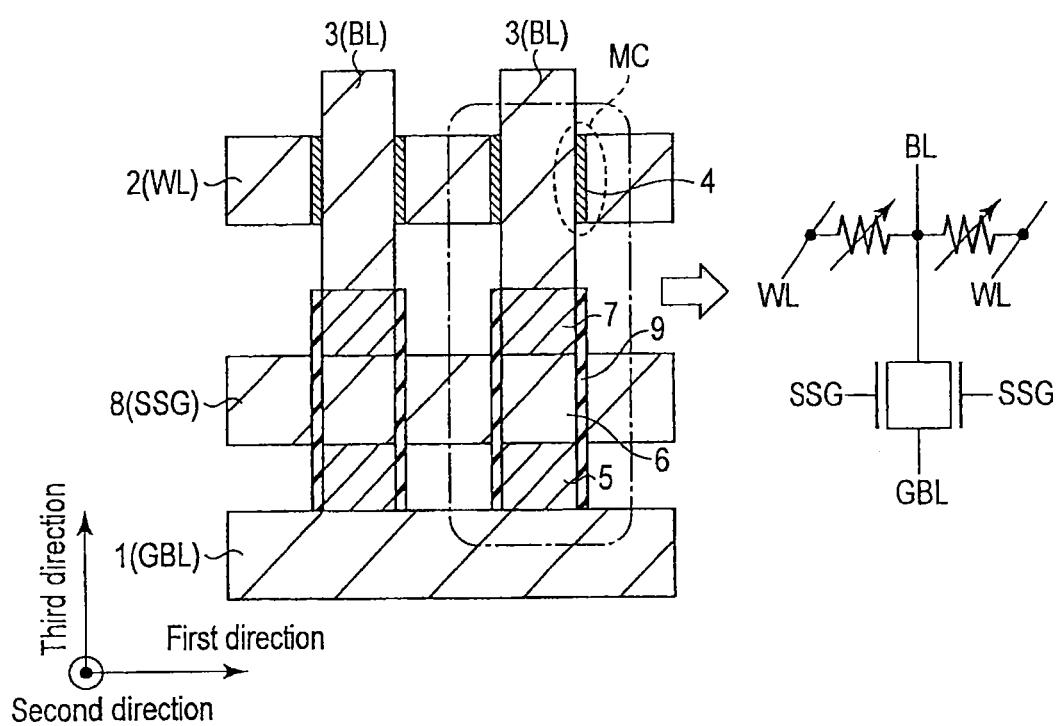
FIG. 22 is an example of a partial cross-sectional view of the memory cell array of FIG. 21.

FIG. 22 illustrates an example of a partial cross-sectional view and an equivalent circuit of the memory cell array.

FIG. 22 is a partial cross-section of the inside of the plane formed in the first direction and the third direction of FIG. 21. As illustrated, a source region 5, a channel region 6, and a drain region 7 are sequentially stacked on a global bit line GBL to form a selection element SS. A gate insulating layer 9 is formed on a side surface of the stacked structure.

Since each selection element SS is identical to the first embodiment, a description thereof will be omitted.

A pillar-shaped bit line BL is formed on the drain region 7 of each selection element SS. A resistance change material 4 functioning as a memory cell MC is formed on a side surface of the bit line BL. Moreover, a word line WL is formed in a region between adjacent bit lines BL in the first direction.

The resistance change material 4 is formed using, for example, TaON as a material such that the resistance change material 4 contacts with the bit line BL and the word line WL. In addition to TaON, it is possible to use a thin film that is made of one of materials including TiO, TiON, NiO, AlO, AlON, HfO, HfON, TaO, WO, and WON.

By the above manner, the memory cell MC including the resistance change material 4 provided between the word line WL and the bit line BL is disposed within the memory cell array, for example, in a three-dimensional matrix form. In the present structure, the word line WL and the bit line BL are line-and-space patterns. The word line WL and the bit line BL have only to intersect with each other in a positional relationship, and it is unnecessary to consider a misalignment in a word line direction and a bit line direction.

Therefore, it is possible to loosen alignment accuracy in the memory cell at the time of manufacture. This makes it possible to easily perform the manufacture. This structure is a highly integrated structure that can store 1-bit information in a $2F^2$ region.

FIG. 23 illustrates an example of a top view of the memory cell array.

FIG. 23 is a layout of the inside of the plane formed in the first direction and the second direction of FIG. 21, and in particular, a diagram for describing a plane pattern of any one of the plurality of stacked word lines WL (row lines).

In other words, the memory cell array includes two sets of word lines WL having comb-shaped structures, and regions of the word lines WL on a straight line along the second direction alternately belong to any one of comb-shaped structures. A resistance change material 4 is formed along a side surface of the word line WL having the comb-shaped structure and in a continuous manner.

Since the others are identical to the first embodiment, a description thereof will be omitted.

Also, since the overall configuration or operation of the storage device is identical to that of the first embodiment (FIGS. 4 to 8), a detailed description thereof will be omitted herein.

Next, a method of manufacturing a storage device according to a second embodiment will be described.

FIGS. 24 to 28 illustrate an example of each process of the method of manufacturing the storage device.

First, for example, a general CMOS circuit, which controls an operation of a ReRAM, is formed on a silicon substrate. Subsequently, an interlayer insulating layer is formed on the silicon substrate to cover the CMOS circuit. The following manufacturing method relates to a structure over the interlayer insulating layer.

First of all, by using the same processes as those in the first embodiment, the manufacturing method is performed until an insulating layer 49 (for example, a silicon oxide film) is formed on an entire surface (see FIGS. 9 to 15).

The insulating layer 49 is polished by, for example, a CMP method, so that the insulating layer 49 remains in only the inside of the recess 45. As a result, an upper surface of the silicon layer 44 is exposed.

Subsequently, as illustrated in FIG. 24, an insulating layer 51 (for example, a silicon oxide film) having a film thickness of, for example, 20 nm, is formed on the silicon layer 44 and the insulating layers 49 and 58. Subsequently, sixteen stacked layer units, each of which includes a word line film 52 and an insulating layer 53, are formed on the insulating layer 51. The word line film 52 in each of the stacked layer units corresponds to the word line WL described with reference to FIG. 21.

Also, the word line film 52 is formed using, for example, TaN as a material, and a film thickness thereof is, for example, about 10 nm. Also, the insulating layer 53 is formed using, for example, $SiO_2$ as a material, and a film thickness thereof is, for example, about 7 nm.

Subsequently, an insulating layer (for example, $SiO_2$) 54 having a film thickness of, for example, 13 nm, is formed on the word line film 52 of the uppermost layer (sixteenth layer in this example).

Subsequently, the insulating layers 54, 53 and 51 and the word line film 52 are patterned in a stripe shape along a second direction by a photolithography technique and an RIE technique. Also, the present patterning process is performed, for example, under the condition that a line width is about 20 nm and an adjacent spacing is about 20 nm (a half pitch is 20 nm).

Also, the present process is performed such that the insulating layers 54, 53 and 51 and the word line film 52 remain on the underlying insulating layer 49. As a result of the present process, a word line WL is formed, and simultaneously, the upper surfaces of the silicon layer 44 and the insulating layers 58 and 47 are exposed at the bottom of the recess 55 formed by the patterning.

Subsequently, as illustrated in FIG. 25, a resistance change material film RW made of TaON is selectively formed on the side surface of the word line WL in the first direction. The resistance change material film RW corresponds to the resistance change material (cell) 4 described with reference to FIG. 21. As a result, the resistance change material film RW, which is separated in the third direction and extends in the second direction, is formed.

Herein, the resistance change material film RW is, for example, an oxide film that is formed to a film thickness of about 4 nm by a plasma oxidation process. Also, the resistance change material film RW may be a nitride film or an oxynitride film that is formed by a nitridation process or a plasma oxynitridation process. In any case, the resistance change material film RW includes an oxide or a nitride of an element in the word line WL.

Subsequently, as illustrated in FIG. 26, a bit line film 57 is formed on an entire surface and is polished by a CMP method so that the bit line film 57 remains only within the recess 55. The bit line film 57 corresponds to the bit line BL described with reference to FIG. 21, and is formed using, for example, $n^+$ type polycrystalline silicon as a material.

Figure 27:
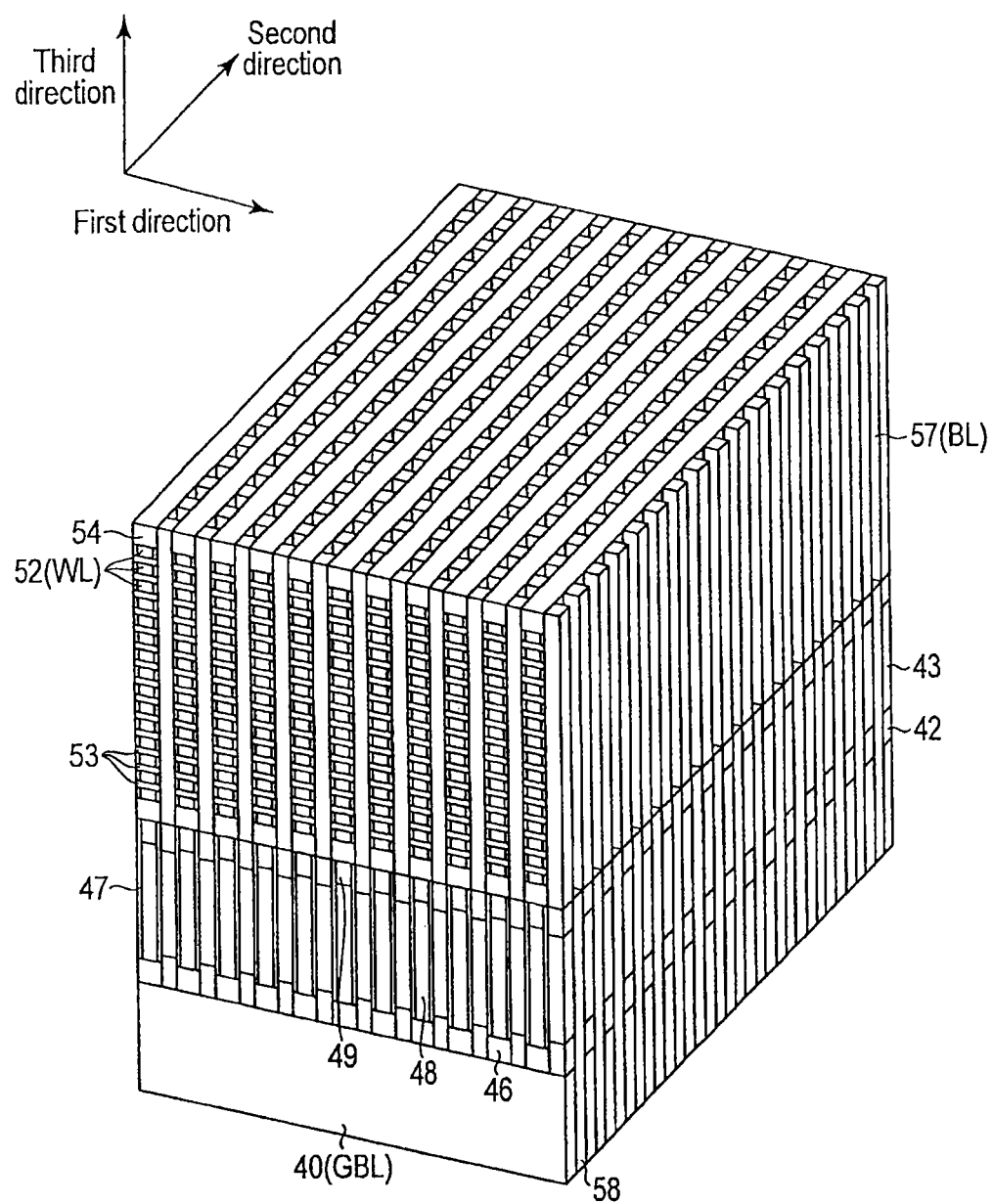

Subsequently, as illustrated in FIG. 27, the bit line film 57 is patterned in a pillar shape by using a photolithography technique and an RIE technique.

The present patterning process is performed, for example, under the condition that a line width and an adjacent spacing are all about 20 nm. Also, the present process is performed such that the bit line film 57 remains on the underlying silicon layer 44. As a result of the present process, a bit line BL is completed.

Subsequently, a recess between adjacent bit lines BL is filled with an interlayer insulating layer, and a memory cell region R1 is completed. Subsequently, as in a typical semiconductor device, a passivation process is performed, and an interconnection connecting portion, which will be an input/output unit, is further formed. Finally, the above-described storage device is completed by performing a so-called post-process, such as an inspection, a dicing, or the like.

3. Third Embodiment

FIG. 28 illustrates a memory cell array according to a third embodiment.

In the third embodiment, there is proposed a cell structure in which a resistance change material (resistance change element) 4 is disposed, for example, between a row line 2 and a column line 3, and the resistance change material 4 is separated between upper and lower row lines 2 and between left and right column lines 3.

If employing such a structure, even though an initial resistance of the resistance change material 4 is low, the resistance change material 4 is separated between the row lines 2 in a third direction and between the column lines 3 in a second direction. Herein, it can be said that the resistance change materials 4 are disposed in a matrix form in the third direction and the second direction. As a result, at the time of a forming, a leakage current can be suppressed and an interference between cells can be reduced. Also, an interference between the memory cells can also be reduced during write, erase, and read operations as well as at the time of the forming.

Hereinafter, a detailed structure will be described.

A plurality of global column lines 1, row lines 2, and column lines 3 is provided within a memory cell array. The global column lines 1 are formed in parallel to each other along the first direction and are disposed in the lowermost layer of the memory cell array. The row lines 2 are formed in parallel to each other along the second direction perpendicular to the first direction respectively, and are provided at positions higher than the global column lines 1. Layers of the row lines 2 (first layer, second layer, third layer, ... of FIG. 1) are provided plurally in the third direction perpendicular to both the first direction and the second direction (normal direction of a surface on which the global column lines 1 are disposed).

The column lines 3 are formed in parallel to each other between the adjacent row lines 2 along the third direction. A one end (lower end) of the column line 3 is electrically connected to any one of the global column lines 1. More specifically, in a two-dimensional plane formed in the first direction and the second direction, the column lines 3 disposed on the same column along the first direction are electrically connected to the same global column line 1.

A memory cell MC including a resistance change element is disposed between each row line 2 and each column line 3. The resistance change element (resistance change material 4) in the memory cell MC includes, for example, an oxide or a nitride of an element in the column line 2. The resistance change material 4 is disposed on a side surface of the row line 2 in the first direction and exists in only an intersecting portion between the row line 2 and the column line 3.

That is, the resistance change materials 4 are separated from each other between the row lines 2 in the third direction and between the column lines 3 in the second direction.

Since parts other than those described above are identical to the first embodiment, a description thereof will be omitted. Since a partial cross-sectional view and an equivalent circuit of the memory cell array are identical to those of the second embodiment, a description thereof will be omitted.

Figure 29:
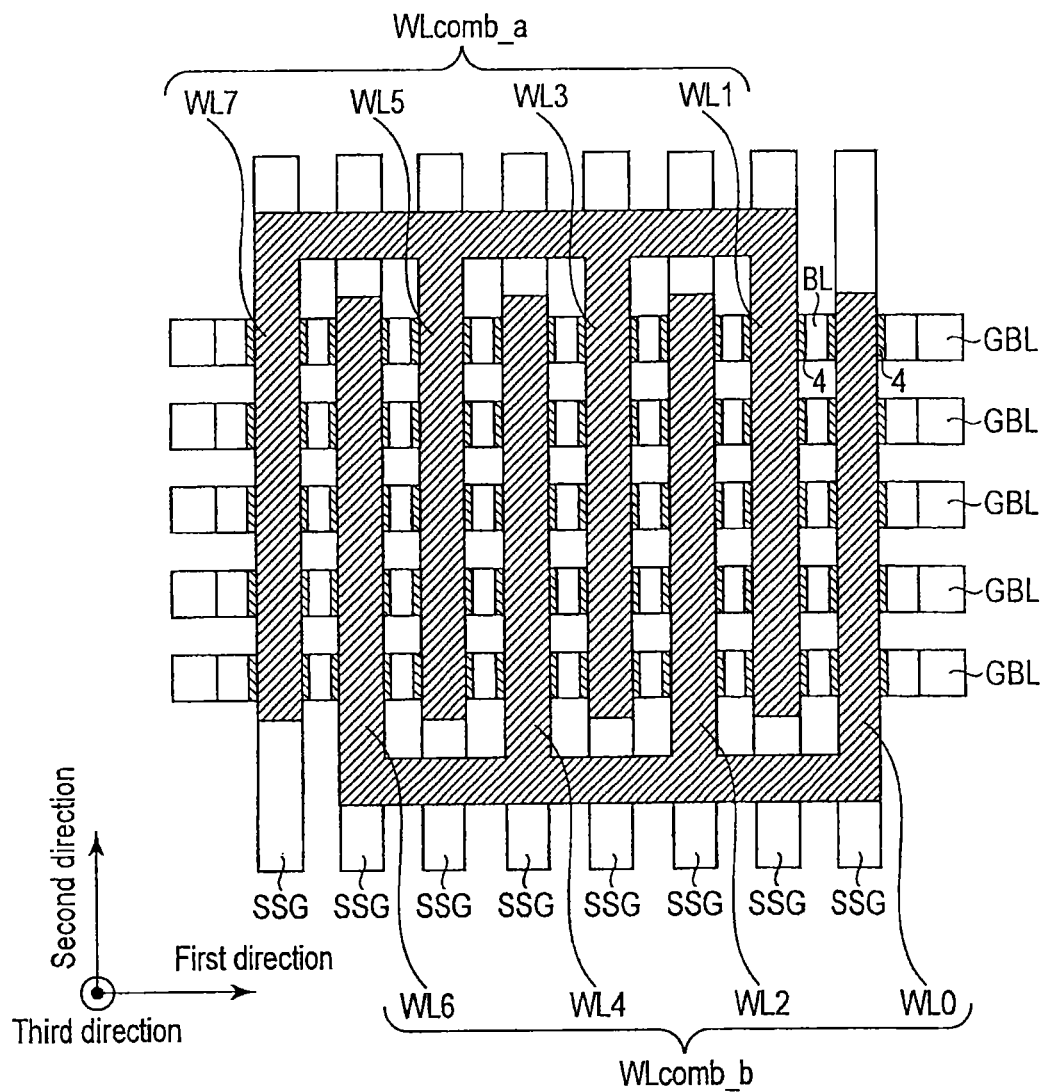
FIG. 29 is an example of a top view of the memory cell array of the third embodiment.

FIG. 29 illustrates an example of a top view of the memory cell array.

FIG. 29 is a layout of the inside of the plane formed in the first direction and the second direction of FIG. 28, and in particular, a diagram for describing a plane pattern of any one of the plurality of stacked word lines WL (row lines).

In other words, the memory cell array includes two sets of word lines WL having comb-shaped structures, and regions of the word lines WL on a straight line along the second direction alternately belong to any one of the comb-shaped structures. Resistance change materials 4 are formed at intersection points of the word lines WL and the bit lines BL having the comb-shaped structure respectively. That is, it can be said that the resistance change materials 4 are formed at only the intersection points of the word lines WL and the bit lines BL.

Since the others are identical to the first embodiment, a description thereof will be omitted.

Also, since the overall configuration or operation of the storage device is identical to that of the first embodiment (FIGS. 4 to 8), a detailed description thereof will be omitted herein.

Next, a method of manufacturing a storage device according to a third embodiment will be described.

Figure 30:
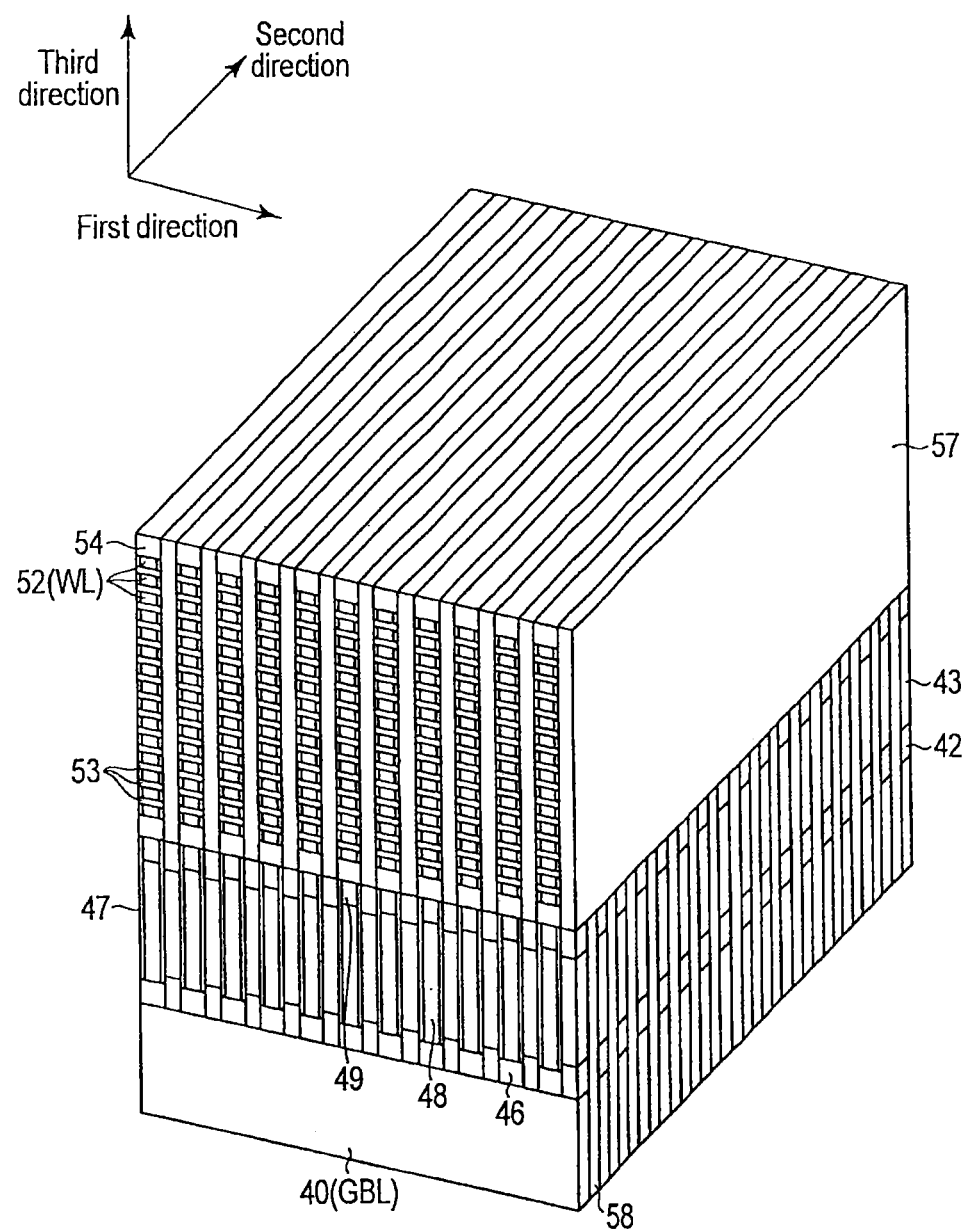

FIGS. 30 to 32 illustrate each process of the method of manufacturing the storage device.

First, for example, a general CMOS circuit, which controls an operation of a ReRAM, is formed on a silicon substrate. Subsequently, an interlayer insulating layer is formed on the silicon substrate to cover the CMOS circuit. The following manufacturing method relates to a structure over the interlayer insulating layer.

First of all, as illustrated in FIG. 30, by using the same processes as those in the first embodiment, the manufacturing method is performed until an insulating layer 49 (for example, a silicon oxide film) is formed on an entire surface (see FIGS. 9 to 15).

Also, by using the same processes as those in the second embodiment, the manufacturing method is performed until a bit line film 57 is formed on an entire surface (see FIGS. 24 to 26).

The bit line film 57 is polished by a CMP method so that the bit line film 57 remains only within the recess 55. The bit line film 57 corresponds to the bit line BL described with reference to FIG. 28, and is formed using, for example, $n^+$ type polycrystalline silicon as a material.

Subsequently, as illustrated in FIG. 31, the bit line film 57 is patterned in a pillar shape by using a photolithography technique and an RIE technique.

The present patterning process is performed, for example, under the condition that a line width and an adjacent spacing are all about 20 nm. Also, the present process is performed such that the bit line film 57 remains on the underlying silicon layer 44. As a result of the present process, a bit line BL is completed.

Herein, in the present example, as illustrated in FIG. 32, the patterning process removes the resistance change material 4 exposed in a space not covered by the bit line BL. In this manner, the resistance change materials (cells) 4 are separated from each other between the upper and lower word lines WL and are also separated from each other between the left and right bit lines BL.

Also, when the bit line BL is patterned, the resistance change material 4 can be simultaneously removed by appropriately selecting an RIE condition (gaseous species or the like).

Subsequently, a recess between the adjacent bit lines BL is filled with an interlayer insulating layer, and a memory cell region R1 is completed. Subsequently, as in a typical semiconductor device, a passivation process is performed, and an interconnection connecting portion, which will be an input/output unit, is further formed. Finally, the above-described storage device is completed by performing a so-called post-process, such as an inspection, a dicing, or the like.

4. Conclusion

According to the present embodiment, in the three-dimensional storage device, which is easy to manufacture and can be highly integrated, the forming operation can be performed without short-circuit between the word lines, even when the initial resistance of the resistance change element (memory cell) before the forming (initialization) is low.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a device, comprising:
stacking stacked layer units repeatedly in a third direction, each of the stacked layer units having a structure stacked in combination of a first conductor, a resistance change material, and an insulator;
forming fin structures longitudinally extending in a second direction by patterning the stacked layer units;
selectively forming an insulating layer on the first conductors in the fin structures extending in a first direction by converting a surface of the first conductor;
filling a second conductor in a space between the fin structures; and
forming a third conductive line extending in the third direction by patterning the second conductor.

2. The method of claim 1, further comprising:
changing a resistance value of each of the resistance change materials from a first value to second value by an initialization, the first value being smaller than the maximum of storage values in which the resistance change materials selectively have in a normal operation after the initialization.

3. The method of claim 1, further comprising:
forming the insulating layer on the surface of the first conductor in the first direction by forming one of an oxide and a nitride of an element in the first conductor in each of the stacked layer units.

4. A method of manufacturing a device, comprising:
stacking stacked layer units repeatedly in a third direction, each of the stacked layer units having a structure stacked in order of a first conductor and an insulator;
forming fin structures longitudinally extending in a second direction by patterning the stacked layer units;
selectively forming a resistance change material on the first conductors in the fin structures by converting a surface of the first conductor, the resistance change material longitudinally extending in the second direction and having a thickness extending in the first direction;
filling a second conductor in a space between the fin structure; and
forming a third conductive line by patterning the second conductor.

5. The method of claim 4, further comprising:
changing a resistance value of each of the resistance change materials from a first value to a second value by an initialization, the first value being smaller than the maximum of storage values in which the resistance change materials selectively have in a normal operation after the initialization.

6. The method of claim 4, further comprising:
selectively forming the resistance change material on the surface of the first conductor in the first direction by forming one of an oxide and a nitride of an element in the first conductor in each of the stacked layer units.

7. The method of claim 4, further comprising:
selectively removing the resistance change material exposed in a space not covered by the third conductive line, when the second conductor is patterned.

* * * * *